United States Patent
Lan et al.

(10) Patent No.: US 7,273,766 B1
(45) Date of Patent: Sep. 25, 2007

(54) VARIABLE DENSITY AND VARIABLE PERSISTENT ORGANIC MEMORY DEVICES, METHODS, AND FABRICATION

(75) Inventors: Zhida Lan, Cupertino, CA (US); Michael A. Van Buskirk, Saratoga, CA (US); Tzu-Ning Fang, Palo Alto, CA (US); Colin Bill, Cupertino, CA (US); John S. Ennals, Cupertino, CA (US)

(73) Assignee: Spansion LLC, Sunnyvale, CA (US)

( * ) Notice: Subject to any disclaimer, the term of this patent is extended or adjusted under 35 U.S.C. 154(b) by 373 days.

(21) Appl. No.: 11/034,071

(22) Filed: Jan. 12, 2005

(51) Int. Cl.
*H01L 21/00* (2006.01)
(52) U.S. Cl. .................. 438/82; 438/99; 257/40
(58) Field of Classification Search ........... 438/82; 257/40
See application file for complete search history.

(56) References Cited

U.S. PATENT DOCUMENTS

| | | | |
|---|---|---|---|
| 4,753,861 A * | 6/1988 | Tsou et al. ............ 430/19 |
| 6,656,763 B1 | 12/2003 | Oglesby et al. |
| 6,686,263 B1 | 2/2004 | Lopatin et al. |
| 6,746,971 B1 | 6/2004 | Ngo et al. |
| 6,753,247 B1 | 6/2004 | Okoroanyanwu et al. |
| 6,766,157 B1 * | 7/2004 | Hunzeker et al. ...... 455/317 |
| 6,768,157 B2 * | 7/2004 | Krieger et al. ......... 257/314 |
| 6,770,905 B1 | 8/2004 | Buynoski et al. |
| 6,773,954 B1 | 8/2004 | Subramanian et al. |
| 6,781,868 B2 | 8/2004 | Bulovic et al. |
| 6,787,458 B1 | 9/2004 | Tripsas et al. |
| 6,803,267 B1 | 10/2004 | Subramanian et al. |
| 6,825,060 B1 | 11/2004 | Lyons et al. |
| 2004/0084670 A1 * | 5/2004 | Tripsas et al. ......... 257/40 |
| 2004/0159835 A1 * | 8/2004 | Krieger et al. ......... 257/40 |
| 2006/0215458 A1 * | 9/2006 | Takeuchi ............. 365/185.25 |

* cited by examiner

*Primary Examiner*—Michael Lebetritt
*Assistant Examiner*—Abdulfattah Mustapha
(74) *Attorney, Agent, or Firm*—Amin, Turocy & Calvin, LLP

(57) ABSTRACT

An organic memory device comprising two electrodes having a selectively conductive decay media between the two electrodes provides a capability to control a persistence level for information stored in an organic memory cell. A resistive state of the cell controls a conductive decay rate of the cell. A high and/or low resistive state can provide a fast and/or slow rate of conductive decay. One aspect of the present invention can have a high resistive state equating to an exponential conductive decay rate. Another aspect of the present invention can have a low resistive state equating to a logarithmic conductive decay rate. Yet another aspect relates to control of an organic memory device by determining a power state and setting a resistive state of an organic memory cell based upon a current power state and/or an imminent power state.

28 Claims, 17 Drawing Sheets

VARIABLE DENSITY AND VARIABLE PERSISTENT ORGANIC MEMORY DEVICES, METHODS, AND FABRICATION

TECHNICAL FIELD

The present invention relates generally to organic memory devices and, in particular, to organic memory devices with variable persistent memory storage capabilities.

BACKGROUND ART

The volume, use and complexity of computers and electronic devices are continually increasing. Computers consistently become more powerful while new and improved electronic devices are continually developed (e.g., digital audio players, video players). Additionally, the growth and use of digital media (e.g., digital audio, video, images, and the like) have further pushed development of these devices. Such growth and development has vastly increased the amount of information desired/required to be stored and maintained for computer and electronic devices.

Generally, information is stored and maintained in one or more of a number of types of storage devices. Storage devices include long term storage mediums such as, for example, hard disk drives, compact disk drives and corresponding media, digital video disk (DVD) drives, and the like. The long term storage mediums typically store larger amounts of information at a lower cost, but are slower than other types of storage devices. Storage devices also include memory devices which are often, but not always, short term storage mediums. Memory devices tend to be substantially faster than long term storage mediums. Such memory devices include, for example, dynamic random access memory (DRAM), static random access memory (SRAM), double data rate memory (DDR), flash memory, read only memory (ROM), and the like. Memory devices are subdivided into volatile and non-volatile types. Volatile memory devices generally lose their information if they lose power and typically require periodic refresh cycles to maintain their information. Volatile memory devices include, for example, random access memory (RAM), DRAM, SRAM and the like. Non-volatile memory devices maintain their information whether or not power is maintained to the devices. Non-volatile memory devices include, but are not limited to, ROM, programmable read only memory (PROM), erasable programmable read only memory (EPROM), flash memory and the like. Volatile memory devices generally provide faster operation at a lower cost as compared to non-volatile memory devices.

Memory devices generally include arrays of memory cells. Each memory cell can be accessed or "read", "written", and "erased" with information. The memory cells maintain information in an "OFF" or an "ON" state (e.g., are limited to 2 states), also referred to as "0" and "1". Typically, a memory device is addressed to retrieve a specified number of byte(s) (e.g., 8 memory cells per byte). For volatile memory devices, the memory cells must be periodically "refreshed" in order to maintain their state. Such memory devices are usually fabricated from semiconductor devices that perform these various functions and are capable of switching and maintaining the two states. The devices are often fabricated with inorganic solid state technology, such as, crystalline silicon devices. A common semiconductor device employed in memory devices is the metal oxide semiconductor field effect transistor (MOSFET).

The use of portable computer and electronic devices has greatly increased demand for non-volatile memory devices. Digital cameras, digital audio players, personal digital assistants, and the like generally seek to employ large capacity non-volatile memory devices (e.g., flash memory, smart media, compact flash, . . . ).

Because of the increasing demand for information storage, memory device developers and manufacturers are constantly attempting to increase storage capacity for memory devices (e.g., increase storage per die or chip). A postage-stamp-sized piece of silicon may contain tens of millions of transistors, each transistor as small as a few hundred nanometers. However, silicon-based devices are approaching their fundamental physical size limits. Inorganic solid state devices are generally encumbered with a complex architecture which leads to high cost and a loss of data storage density. The volatile semiconductor memories based on inorganic semiconductor material must constantly be supplied with electric current with a resulting heating and high electric power consumption in order to maintain stored information. Non-volatile semiconductor devices have a reduced data rate and relatively high power consumption and large degree of complexity.

Currently, devices that can store large amounts of data in a nonvolatile manner, such as hard drives and optical media, are also physically large. These devices require a means to rotate the media so information can be stored and read. This requires additional power, parts and size not required by solid state type memory devices. Thus, when size is a factor, solid state memory is normally utilized. Tremendous strides have been accomplished in decreasing the size of these types of memory. A one square centimeter sized piece of silicon may contain tens of millions of solid state entities. Despite the great improvements in the solid state area, society continues to demand better and smaller memory devices.

Inorganic type solid state semiconductor devices generally require intricate architectures that directly drive production costs up and data storage density down. The non-volatile variety of these semiconductor devices consumes a relatively high amount of power to change states. And, the volatile variety of these semiconductor devices requires a constant voltage source that consumes even more power than the nonvolatile type.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The present invention provides semiconductor devices that possess one or more of the following: small size compared to inorganic semiconductor devices, capability to store information short term and/or long term, quick operational response time, lower operating voltages, low cost, high reliability, long life, increased current flow over inorganic semiconductor devices, low temperature processing, light weight, and high density.

One aspect of the present invention relates to an organic memory device with selectively conductive decay media. This allows variability of the density and variability of the persistence of stored data by altering a resistive state of the organic memory device. Thus, a single device can be utilized, at will, as a long term information storage device with a smaller variable density range and/or as a short term information storage device with a larger variable density range. The same device can be operated in a mixed mode that can be comprised of a plurality of cells having long term storage capability with a small density range; a plurality of cells having a medium term storage capability with a medium density range; and/or a plurality of cells having short, medium, and large density ranges. This eliminates the need for multiple types of storage devices (e.g., volatile and nonvolatile), simplifying memory circuitry, and increasing information storage persistence flexibility on a cell by cell basis.

In another aspect in accordance with the present invention, a graphical technique varies an amount of memory density versus a retention time of a resulting memory cell. It is to be appreciated varying a memory density versus retention time is a natural extension of a measured response of a utilized memory material. In one aspect in accordance with the present invention, a voltage is applied to a memory cell providing varying densities, wherein the varying density provides an increase or decrease in retention time. Based at least in part upon a measured response curve for a memory material, resistive states are available to a memory cell, wherein an applied voltage changes resistance. The resistance change allows a memory cell to operate in a resistive state, wherein the resistive state is associated with a retention time. A memory cell having more resistive states correlates to a limited retention time. Conversely, a memory cell having limited resistive states correlates to a substantial retention time.

Another aspect of the present invention relates to a method of fabricating an organic semiconductor device utilizing selectively conductive decay media. This allows formation of an organic memory device that can alter its density and persistence of stored information based upon a resistive state. Fabricating the organic semiconductor device according to the present invention, produces a highly flexible device that can replace multiple devices while decreasing power and area requirements, thus, reducing manufacturing costs and increasing device density.

Yet another aspect of the present invention relates to a system with a means to determine a level of persistence for information to be stored into memory and a means for setting a resistive state of an organic memory cell based on the level of persistence.

Still yet another aspect of the present invention relates to a system for controlling an organic memory device with a means for determining a power state of a device utilizing an organic memory cell comprising a selectively conductive decay media and a means for setting at least one resistive state of at least one organic memory cell based, at least in part, upon a current power state and/or an imminent power state (e.g., ON, OFF, standby, hibernation, and the like).

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
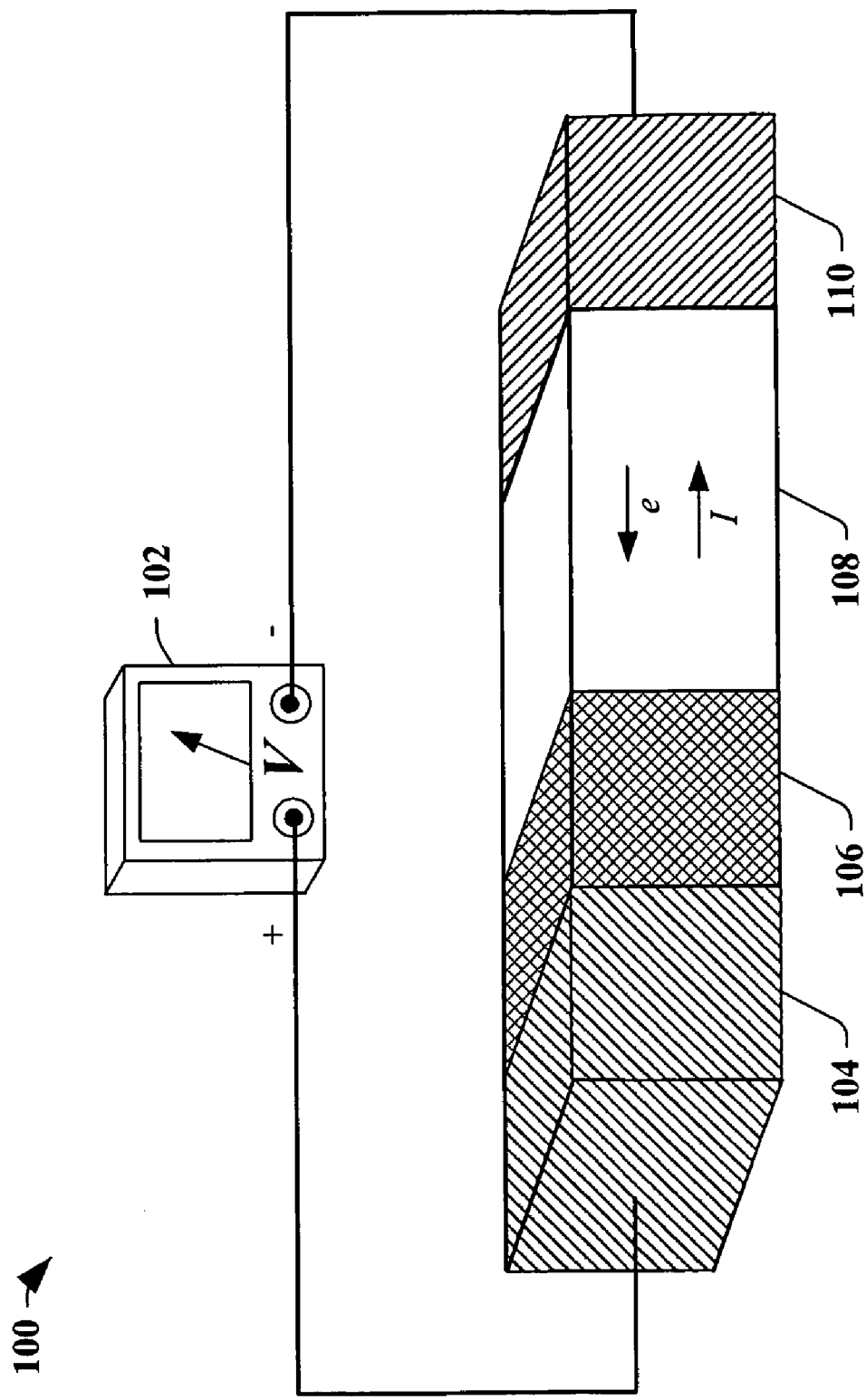
FIG. 1 is a three dimensional diagram of an organic memory device in accordance with an aspect of the present invention.

The following is a detailed description of the present invention made in conjunction with the attached figures, wherein like reference numerals will refer to like elements throughout.

The present invention is an organic memory device that has the capability to alter its density and level of persistence by changing a resistive state of the organic memory device.

The resistive state is changed by applying a voltage potential across an organic memory cell composed of a selectively conductive decay media. A single cell can be set at different resistances to allow multiple bit states per cell which provides a higher device density. At high resistive states, a device's density can be altered in a wide range. For example, at a high resistive state of approximately 10,000 ohms, a single cell can have variable states in a substantially similar order of magnitude with a substantially similar level of persistence. Therefore, the present invention provides higher density memory devices and the flexibility to change in an opposite direction. Thus, a high resistive state provides short persistence and a low resistive state provides long persistence. This produces a device capable of being a long term and/or a short term memory storage device. Therefore, the need for separate long term (e.g., nonvolatile) and short term (e.g., volatile) memory is eliminated. Additionally, a device is provided that operates with a higher density in a short term state and/or operates with a lower density in a long term state. A higher resistive state of a device requires less voltage (power) to operate. Thus, a device operates with low power in a short term state and/or operates with high power in a long term state. The present invention also drastically reduces the power requirements for both short and long term storage compared to typical inorganic volatile and nonvolatile memory devices.

The present invention provides this capability via a selectively conductive decay media which is controlled by the resistive state of an organic memory cell. A high and/or low resistive state can provide a fast and/or slow rate of conductive decay, increasing a conductive period (retention time). One aspect of the present invention, for example, can have a high resistive state equating to an exponential conductivity decay rate. Another aspect of the present invention can have a low resistive state equating to a logarithmic or even slower conductivity decay rate. In this manner, the decay rate controls the persistence of stored information in the organic memory cell. Various levels of persistence can be achieved by altering the composition of the selectively conductive decay media. One skilled in the art can appreciate the level of flexibility afforded by the present invention. Resistive states, rates of decay and voltage potentials can all be utilized to facilitate a level of persistence of the stored information in the organic memory cell.

Varying the density and storage method is advantageous for many reasons. In one instance of the present invention, utilizing a memory device in short term mode (e.g., similar to DRAM and other volatile memory devices) can be achieved while a semiconductor device, such as a computer and the like, is under power. Long term mode (e.g., similar to flash memory and other nonvolatile memory devices) can then be set before the device is shutdown, providing long term storage. This allows for almost instantaneous restarts after power is once again applied to the device, eliminating loading volatile memory upon power-up. In another instance of the present invention, for example, memory for a mobile cellular telephone and the like can be switched from high density (short persistence) during high-speed, large memory device operation to low density (long persistence) during low-speed, long-term critical memory operations, reducing power demands. In yet another instance of the present invention, typical high speed memory performance is achieved with a voltage potential of a range of approximately 3 to 5 volts. Similarly, a state of a memory device can typically be read with a voltage potential from about 10 to about 200 millivolts.

In FIG. 1, a diagram of an organic memory device in accordance with an aspect of the present invention is shown. The memory device includes a first electrode 104, a passive layer 106, an organic conductor layer 108 and a second electrode 110. The diagram also illustrates a voltage source 102 connected to the first electrode 104 and the second electrode 110 that applies a voltage on the first electrode 104 and the second electrode 110.

The first electrode 104 and the second electrode 110 are comprised of a conductive material. The thickness of the first electrode 104 and the second electrode 110 can vary depending on the implementation and the memory device being constructed. The organic conductor layer 108 and the passive layer 106 are collectively referred to as a selectively conductive decay media. The conductive decay properties of this media (e.g., exponential decay rate, logarithmic decay rate, and the like) can be modified in a controlled manner by applying varying voltage potentials across the media via the electrodes 104 and 110 in order to alter a resistive state of the organic memory device.

The organic conductor layer 108 is comprised of a conjugated organic material. If the organic layer is a polymer, a polymer backbone of the conjugated organic polymer may extend lengthwise between the electrodes 104 and 110 (e.g., generally substantially perpendicular to the inner, facing surfaces of the electrodes 104 and 110). The conjugated organic molecule can be linear or branched such that the backbone retains its conjugated nature. Such conjugated molecules are characterized in that they have overlapping π orbitals and that they can assume two or more resonant structures. The conjugated nature of the conjugated organic materials contributes to the conductive decay properties of the selectively conductive decay media.

In this configuration, the conjugated organic material has the ability to donate and accept charges (holes and/or electrons). Generally, the conjugated organic molecule has at least two relatively stable oxidation-reduction states. The two relatively stable states permit the conjugated organic polymer to donate and accept charges and electrically interact with the passive layer. The organic materials may be cyclic or acyclic. Additionally, the conjugated polymer can be doped and dedoped by dopant such as with metal ions or neutral materials.

For some cases such as organic polymers, the organic material self assembles between the electrodes during formation or deposition. The organic conductor layer 108 has a suitable thickness that depends upon the chosen implementations and/or the memory device being fabricated. This layer 108 can be formed by a number of suitable techniques. One such technique is spin-on which involves depositing a mixture of the material and a solvent, and then removing the solvent from the substrate/electrode. Another suitable technique is chemical vapor deposition. CVD includes low pressure chemical vapor deposition (LPCVD), plasma enhanced chemical vapor deposition (PECVD), and high density chemical vapor deposition (HDCVD). It is not typically necessary to functionalize one or more ends of the organic molecule in order to attach it to an electrode/passive layer. Sometimes, it may have a chemical bond formed between the conjugated organic polymer and the passive layer 106.

The passive layer 106 contains at least one charge carrier assisting material that contributes to the controllable conductive decay properties of the selectively conductive decay media. The charge carrier assisting material has the ability to donate and accept charges (holes and/or electrons). Generally, this material has at least two relatively stable oxidation-reduction states. These states permit the charge carrier assisting material to donate and accept charges and electrically interact with the organic conductor layer 108. The particular charge carrier assisting material employed is selected so that the two relatively stable oxidation states match with the two relatively stable oxidation states of the conjugated organic molecule of the layer 108.

The passive layer 106 can in some instances act as a catalyst when forming the organic conductor layer 108. In this configuration, the backbone of the conjugated organic molecule may initially form adjacent the passive layer 106, and grow or assemble away and substantially perpendicular to the passive layer surface. As a result, the backbones of the conjugated organic molecules may be self aligned in a direction that traverses the two electrodes.

Examples of charge carrier assisting materials that may make up the passive layer 106 include one or more of nickel arsenide (NiAs), cobalt arsenide ($CoAs_2$), copper sulfide ($Cu_2S$, CuS), copper oxide (CuO, $Cu_2O$), manganese oxide ($MnO_2$), titanium dioxide ($TiO_2$), indium oxide ($I_3O_4$), silver sulfide ($Ag_2S$, AgS), iron oxide ($Fe_3O_4$), and the like. The passive layer 106 may be grown using oxidation techniques, formed by gas phase reactions, or deposited between the electrodes. The passive layer 106 has a suitable thickness that can vary on the implementation and/or memory device being fabricated.

In order to facilitate operation of the organic memory device, the organic conductor layer 108 is generally thicker than the passive layer 106. In one aspect, the thickness of the organic conductor layer is from about 1 to about 500 times greater than the thickness of the passive layer. It is appreciated that other suitable ratios can be employed in accordance with the present invention.

The organic memory device, like conventional memory devices, can have two states, a low impedance or "ON" state or high impedance or "OFF" state. However, unlike conventional memory devices, the organic memory device is able to maintain a plurality of states, in contrast to a conventional memory device that is limited to two states (e.g., OFF or ON). The organic memory device can employ varying degrees of resistivity to identify additional states. For example, the organic memory device can have a very low impedance state, a low impedance state, a medium level impedance state, and a high impedance state. This enables the storage of multiple bits of information in a single organic memory device, such as 2 or more bits of information or 4 or more bits of information (e.g., 4 states providing 2 bits of information, 8 states providing 3 bits of information, etc.). It also allows certain impedance states, for example, such as an extreme high and/or low resistive state to be utilized to trigger different conductive decay rates within the selectively conductive decay media. Thus, an organic memory cell utilizing the present invention can both store different states for information storage and, at the same time, allow the conductivity decay rate to be altered, providing long and/or short term information storage as required. This can be accomplished on a cell by cell basis as opposed to conventional memory devices that are either all short term or all long term memory cells.

During typical device operation, electrons flow from the second electrode 110 through the selectively conductive decay media to the first electrode based on a voltage applied to the electrodes by the voltage source 102 if the organic conductor layer 108 is an n-type conductor. Holes flow from the first electrode 104 to the second electrode 110 if the organic conductor layer 108 is a p-type conductor. Both electrons and holes flow in the organic conductor layer 108 if it can be both n- and p-type with the proper energy band match with the passive layer 106 and second electrode 110. As such, current flows from the first electrode 104 to the second electrode 110 through the selectively conductive decay media.

Switching the organic memory device to a particular state is referred to as programming or writing. Programming is accomplished by applying a particular voltage above a threshold voltage such as, for example, 9 volts, 2 volts, and/or 1 volt and the like (assuming these voltage levels are above a given threshold voltage), across the selectively conductive decay media by the electrodes 104 and 110. A device operation mode can be set by this particular operation voltage. Thus, there is typically a separate threshold voltage that corresponds to a respective desired state (e.g., "OFF"; "ON"). The threshold value varies depending upon a number of factors including the identity of the materials that constitute the organic memory device, the thickness of the various layers, and the like. The voltage supply 102 is controllable and employed to apply the threshold voltage in this aspect of the invention. However, other aspects of the invention can utilize other means to apply threshold voltages.

Generally speaking, the presence of an external stimuli such as an applied electric field that exceeds a threshold value ("ON" state) permits an applied voltage to write from the organic memory device; whereas the absence of the external stimuli that exceeds a threshold value ("OFF" state) prevents an applied voltage to write or erase information into/from the organic memory device.

To read information from the organic memory device, a voltage or electric field (e.g., 0.2 volts, 0.1 volts, 0.05 volts, etc.) is applied by the voltage source 102. Then, an impedance measurement is performed that determines the operating state of the memory device (e.g., high impedance, very low impedance, low impedance, medium impedance, and the like). As stated previously, the impedance relates to, for example, "ON" (e.g., 1) or "OFF" (e.g., 0) for a dual state device. Multiple bit states per cell are achieved by applying different voltage levels above a threshold voltage. For example, a cell can be set at resistance R1, R2, R3, and R4 at four different voltages (e.g., 2.0, 1.98, 1.96, and 1.97) corresponding to "00", "01", "10", or "11" for a quad state device. It is appreciated that other numbers of states can provide other binary interpretations. A device can be operated in a long term mode that is usually also a low density mode, and usually a low speed mode (or high speed mode using much higher voltages). In an opposing operation mode (short term, high density), a device can be operated using low voltages. To erase information written into the organic memory device, a negative voltage or a polarity opposite the polarity of the writing signal that exceeds a threshold value is applied. Additionally, altering resistive (impedance) states at the extreme spectrums can be one aspect of utilizing the present invention to alter the conductive decay rate to produce long term and/or short term storage.

Figure 2:
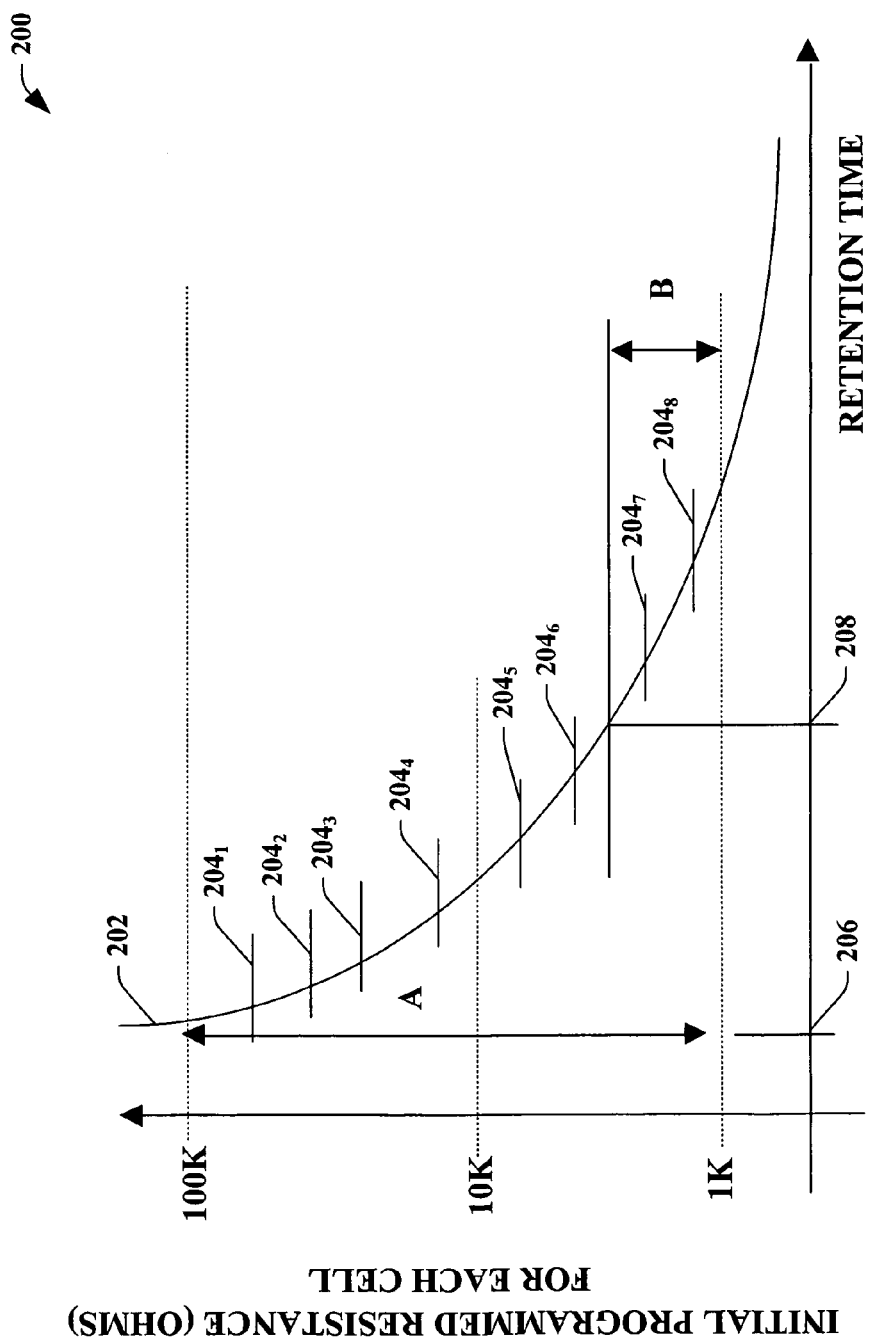
FIG. 2 is a graphical technique that can be employed in an organic memory device in accordance with an aspect of the present invention.

Now turning to FIG. 2, a graphical representation 200 of varying an amount of memory density in accordance with the present invention is illustrated. The present invention utilizes a novel concept of varying an amount of memory density versus a retention time of a resulting memory cell, wherein a voltage applied to the memory cell provides a change in resistance. Changing resistance in a memory cell allows differing densities to exist, which in turn, varies the retention time of such memory cell. FIG. 2 illustrates a measured response curve 202 for a memory material, wherein such measured response curve 202 is plotted as a function of initial programmed resistance for each cell (in, for example, Ohms) and retention time. Based at least in part upon measured response curve 202 for a memory material, numerous resistive states (collectively referred to as resistive states 204) of a memory cell are available. Such resistive states are illustrated as $204_1$, $204_2$, $204_3$, $204_4$, $204_5$, $204_6$, $204_7$, and $204_8$. It is to be appreciated a memory cell can be established in a resistive state and more available resistive states imply higher densities. For example, a voltage can be applied to a first memory cell changing a resistance to 100K. Such first memory cell can utilize 8 resistive states based upon a density level (e.g., a density level provided by the resistance change created by an applied voltage). Continuing with the example, a second memory cell can be created such that the voltage applied changes a resistance level to 1K, wherein such resistance level provides 2 resistive states. Furthermore, the first memory cell and the second memory cell will have different retention times based at least in part upon the resistive state. It is to be appreciated the novel concept of varying an amount of memory density versus a retention time of a resulting memory cell can be associated with one memory cell and/or a plurality of memory cells.

For example, FIG. 2 is a graphical representation 200 in accordance with one aspect of the present invention utilizing a measure response curve 202 for a memory material, wherein such memory response curve 202 for a memory material provides capabilities of two co-existing operating regions. A first region A is depicted such that a memory cell has a limited retention time 206. Region A provides a wide choice of resistive states 204, yet data retention time is determined by a highest resistive state. Thus, region A provides 8 resistive states 204, but only a limited retention time 206. It is to be appreciated that numerous resistive states imply high density. A second region B is illustrated, wherein a memory cell has a substantial retention time 208. Region B provides limited resistive states (specifically $204_7$ and $204_8$), but a substantial retention time 208. Thus, region B provides only 2 resistive states, but a substantial retention time 208. Additionally, it is to be appreciated limited resistive states imply low density.

Figure 3:
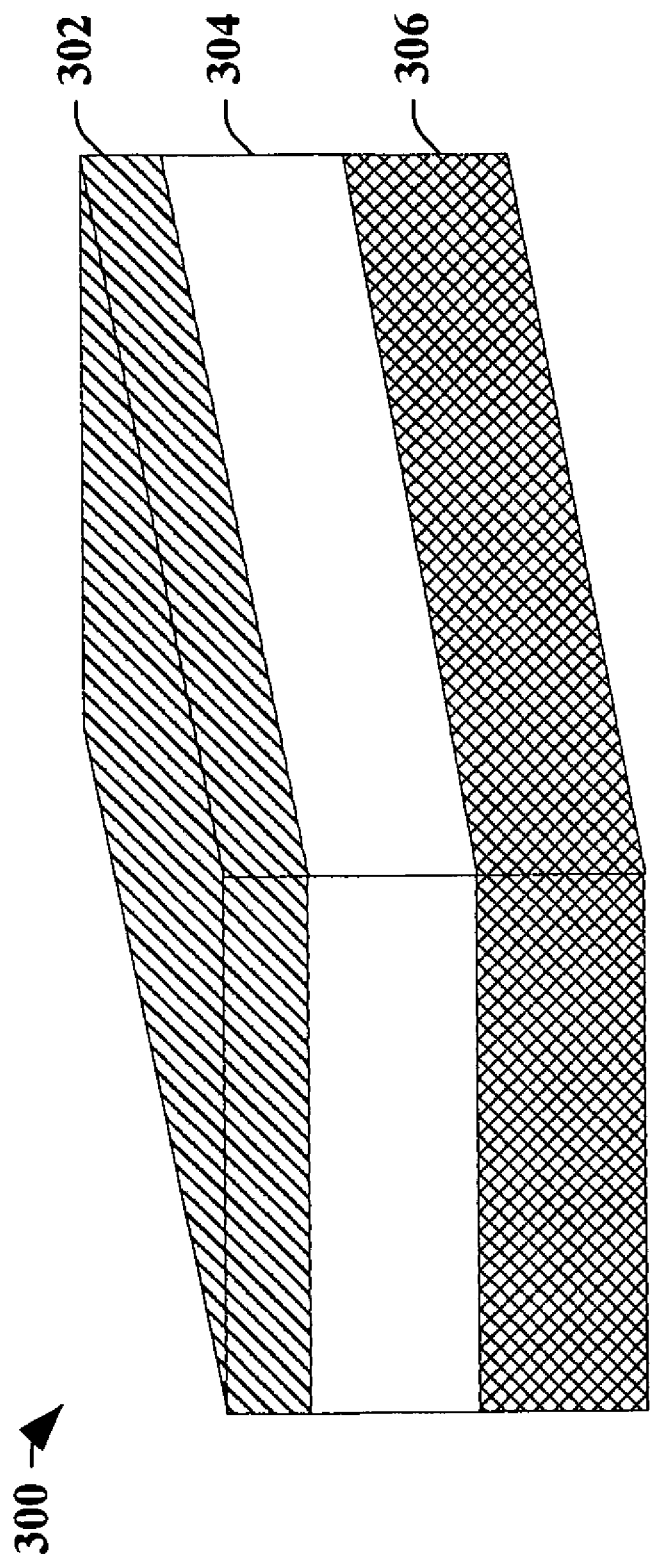
FIG. 3 is a three dimensional diagram of a passive layer that can be employed in an organic memory device in accordance with an aspect of the present invention.

Referring to FIG. 3, a three dimensional diagram that depicts fabrication of a passive layer 300 in accordance with an aspect of the present invention is depicted. A charge carrier assisting material layer is formed by a gas phase reaction operation. A first layer 306 is formed that comprises an element such as Cu. A second layer 304 is formed on the first layer. The second layer comprises charge carrier assisting material such as $Cu_xS$ (e.g., $Cu_2S$, CuS or mixture of both). A third layer 302 is formed on the second layer 304. The third layer 302 contains elements/compounds such as $Cu_2O$, and/or CuO. It is appreciated that alternate aspects of the invention can employ suitable variations in composition and thickness and still be in accordance with the present invention. Thus, the passive layer 300, in one instance of the present invention, can be multiple layers of passive materials and/or passive layers.

Figure 4:
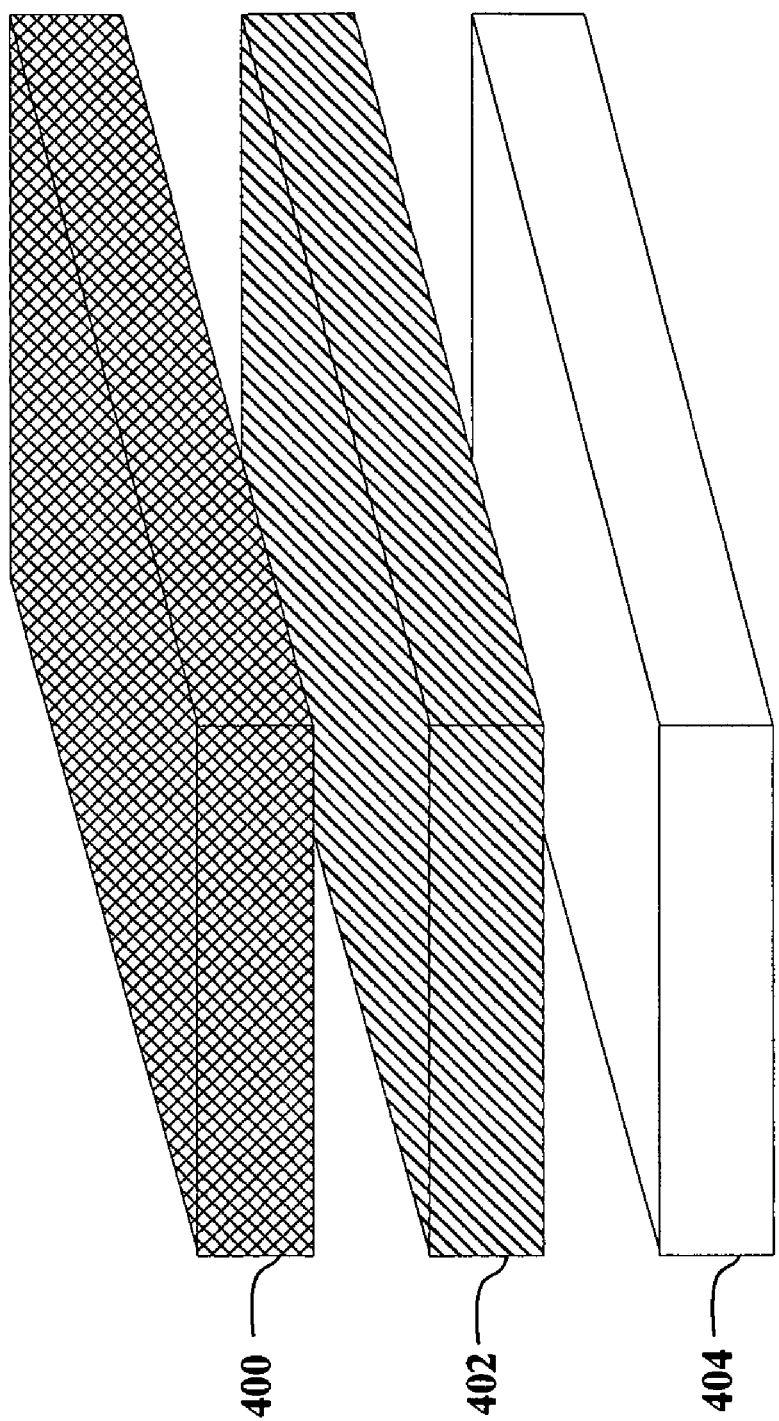
FIG. 4 is a three dimensional exploded view diagram illustrating an organic conductor layer formed by a CVD process in accordance with an aspect of the present invention.

Looking at FIG. 4, a three dimensional exploded view diagram illustrating an organic conductor layer 400 formed by a chemical vapor deposition (CVD) process in accordance with an aspect of the present invention. The layer 400 is formed by a gas phase reaction process. Typically, the organic conductor layer 400 is formed in contact with a passive layer 402 and an electrode 404. The organic conductor layer 400 is comprised of polydiphenylacetylene (DPA).

Figure 5:
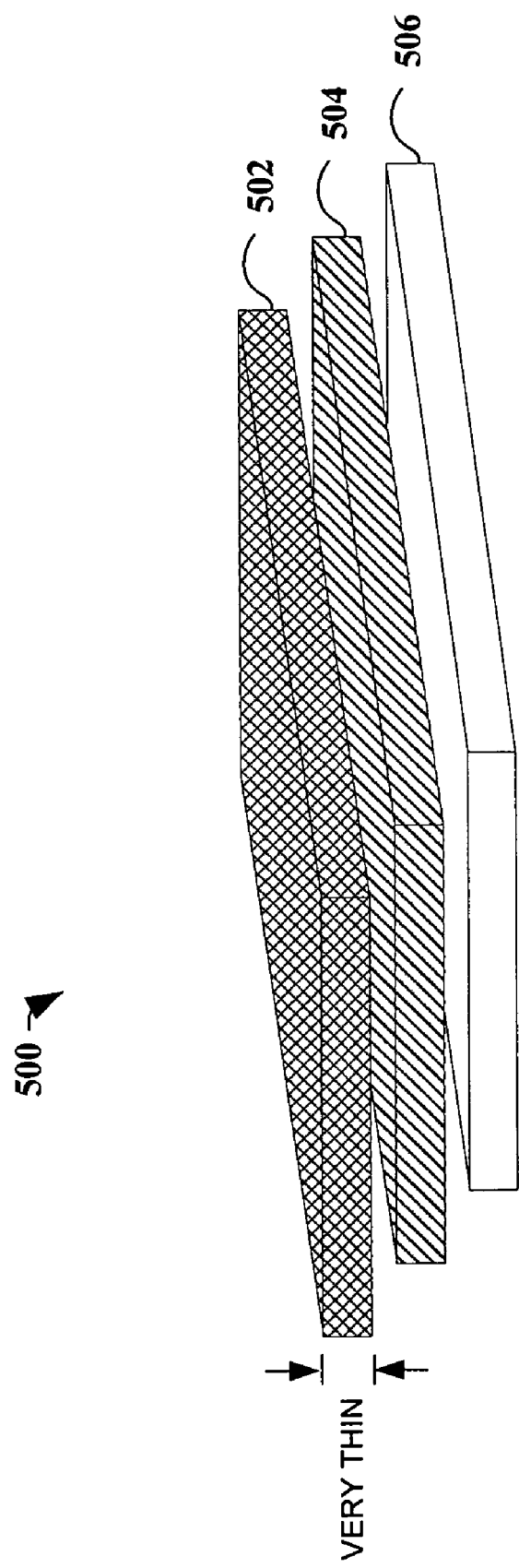
FIG. 5 is a three dimensional diagram illustrating another organic conductor layer formed by a CVD process in accordance with an aspect of the present invention.

Turning now to FIG. 5, a three dimensional diagram depicting another organic conductor layer 500 formed from a CVD process in accordance with an aspect of the present invention is illustrated. Once again, the organic conductor layer 502 is formed by a gas phase reaction process and is very thin compared to the passive layer. The organic conductor layer 502 is formed in contact with a passive layer 504 and an electrode 506. The organic conductor layer 502 is comprised of polyphenylacetylene (PPA).

Figure 6:
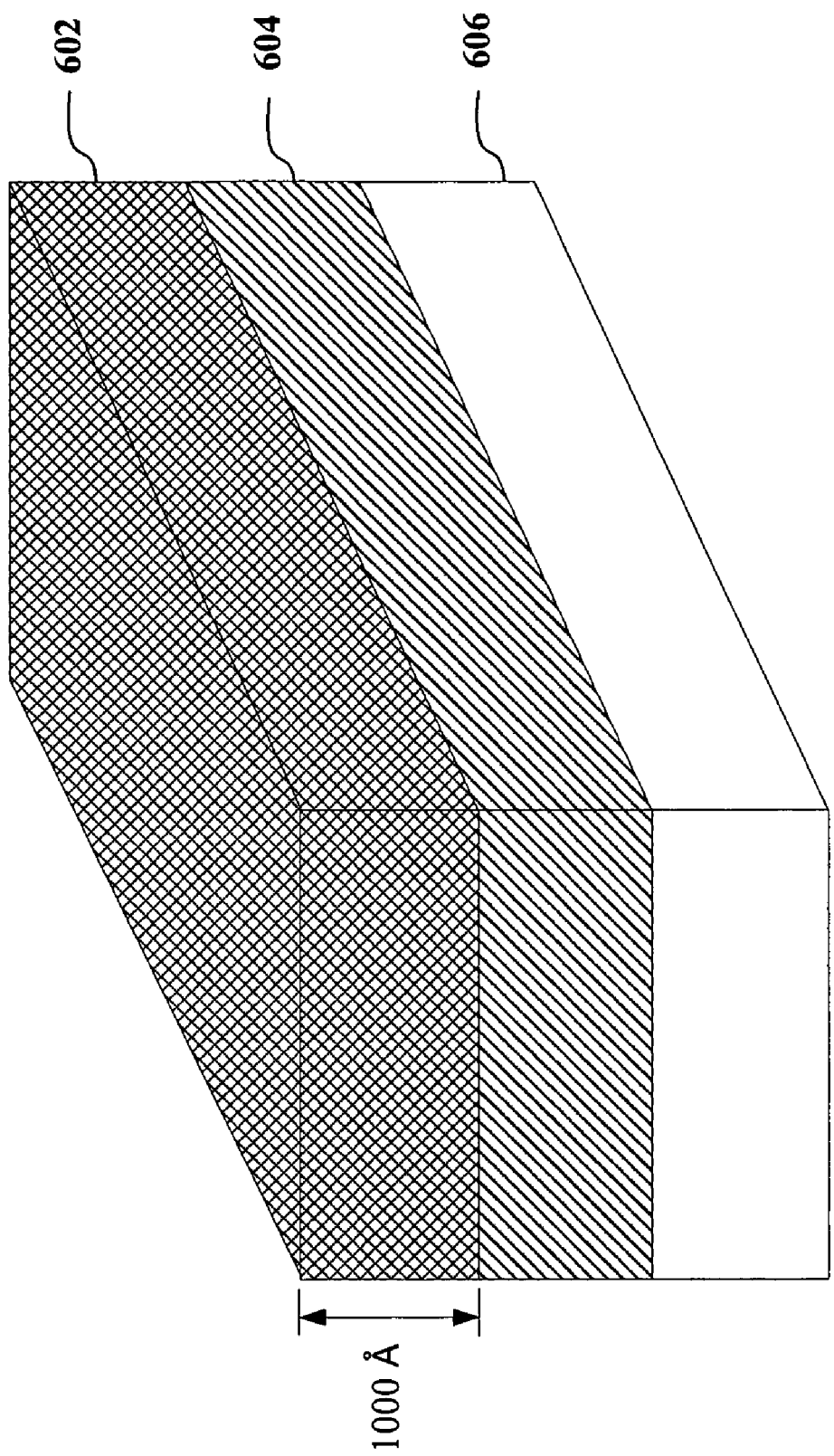
FIG. 6 is a three dimensional diagram of yet another organic conductor layer formed by a CVD process in accordance with an aspect of the present invention.

In FIG. 6, a three dimensional diagram of another organic conductor layer 602 formed by spin coating in accordance with an aspect of the present invention is illustrated. The organic conductor layer 602 is formed by a spin coating process, instead of a gas phase reaction process. The organic conductor layer 602 is formed in contact with a passive layer 604 and an electrode 606. The organic conductor layer 602 is comprised substantially of PPA and has a thickness of about 100 Å.

Experimental results tend to show organic layers formed by spin coating yield a more reliable polymer layer than polymer layers formed by CVD. This may be due to the presence of oxygen and lack of control of heat generated by polymerization under CVD. It is appreciated that controlling heat and oxygen during polymerization for CVD processes can improve the resulting polymer layer. Additionally, organic layers created by CVD can be very thin compared to those created with other methods.

It is to be appreciated that various alternatives to and variations of the layers described in FIGS. 3-6 can be employed in accordance with the present invention.

The passive layer (e.g., CuS) employed in organic memory devices play an important role. Its presence significantly decreases the resistivity (impedance) of the organic layer, and changes the persistence state of a device. There are at least two mechanisms that are believed to allow the passive layer to play this role. One (or two) of the mechanisms may dominate in a device depending on the material of the passive layer.

A first mechanism is believed to be an electronic process that involves charge carriers, such as holes and electrons, during an operation of a device. The passive layer has at least a function in the following: charge carrier generation by the charge carrier assisting material, charge carrier distribution in organic material, and memory loss due to charge carrier redistribution after reversing an electric field. The discussion below describes and illustrates charge carrier concentration and models behavior of organic memory devices.

The following discussion uses conductive polymer as the organic material and CuS as an example of a charge carrier assisting material utilized in the present invention. However, the discussion can also be applied generally to other like charge carrier assisting materials. With respect to charge carrier generation, the copper in CuS is at its highest oxidation state Cu(II). It has relatively strong capability to gain electrons from a contacting polymer and yields the following equation:

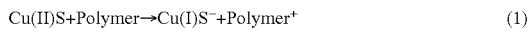

$$Cu(II)S + Polymer \rightarrow Cu(I)S^- + Polymer^+ \quad (1)$$

Figure 7:
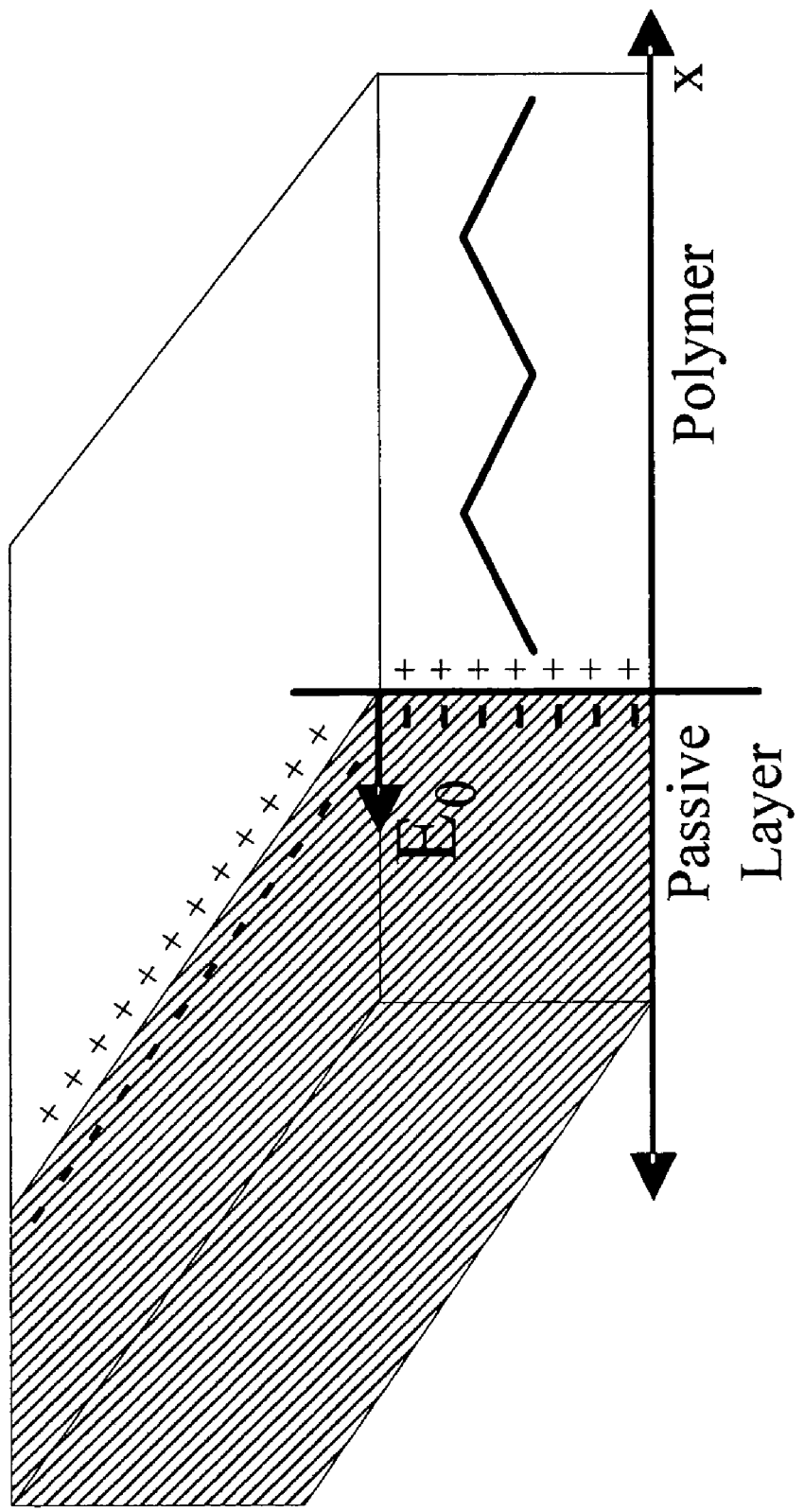
FIG. 7 is a graph depicting the effect of an intrinsic electric field on an interface between a passive layer and an organic conductor layer in accordance with an aspect of the present invention.

The consequence is that an intrinsic field is produced due to the charges accumulated on the interface between CuS and polymer. This is illustrated in FIG. 7, which is a three dimensional graph depicting the effect of an intrinsic electric field on an interface between a passive layer and a polymer. The oxidized polymer (Polymer$^+$) is the charge carrier when external field is applied. The conductivity (or 1/resistivity)

of polymer is determined by its concentration and its mobility by:

$$\sigma = q p \mu \quad (2)$$

where q is the charge of the carrier, p is carrier concentration, and μ is the mobility.

Referring now to the charge depletion layer, employing a similar concept as applied with respect to semiconductors, a potential function can be expressed as:

$$V(x) = q N_p (d_p x - x^2/2) / \in \quad (3)$$

where $N_p$ is the average concentration of charge carrier, $\in$ is the dielectric constant of the polymer, and $d_p$ is the width of the charge depletion. $N_p$ can be obtained by employing the following equation:

$$d_p = \left[ \frac{2\varepsilon (V_b \pm V)}{q N_p} \right]^{1/2} \quad (4)$$

where V is the external field voltage applied. For forward voltage, it is "−" sign. For the reverse voltage, it is "+" sign. The voltage function of Eq. (3) can be approximated to simplify the derivation.

With respect to charge carrier distribution, like p-doping of a semiconductor, two processes typically take place in the electric field. This flux can be expressed as:

$$J = -q D \frac{dp}{dx} + q \mu p E \quad (5)$$

where D is the diffusion constant of the charge carrier, and E is the electric field at x.

When the forward voltage is so large that the current flux J>0, the analytical equation can be derived for steady state flow with some assumption for the voltage distribution in the device. Overall, under forward voltage, the charge distribution p(x) is an increase function of x. When reverse voltage is applied, $V(x) > V_0$, the charge concentration is a decrease function of x.

The final characteristic, conductivity period (retention time), refers to the fact that a forward voltage produces more charge carrier and the charge carrier accumulates more on the other end of the passive layer (away from the organic material). However, this charge carrier concentration will be set back once the voltage is removed, which includes two processes: charge carrier diffusion toward the passive layer and charge carrier recombination on the interface.

Fick's Law can describe the 1st process, charge carrier diffusion toward the passive layer.

$$\frac{dp}{dt} = D \frac{d^2 p}{d^2 x} \quad (6)$$

The charge carrier recombination can be described as follows:

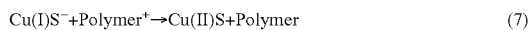
(7)

This conductivity decay rate (reaction rate) is expressed as:

$$\frac{d p(0)}{dt} = k_0 p(0) n(0) \quad (8)$$

where $k_0$ is conductivity decay rate constant and it is temperature dependent.

The conductivity period is the time required to redistribute the charge carrier to the original state and can be determined by equations 6 and 8. It is believed that a higher injected charge carrier concentration exists in a polymer layer because of a forward external field, and, thus, a longer time is required to allow a system to recover to an initial state. That means the persistence of a device is determined by the injected charge carrier under the influence of the external field. Therefore, variable persistence can be achieved by adjusting an external voltage that provides the external field. It is likely that the conductivity decay rate depicted in Eq. 8 is relatively faster than diffusion rate. Therefore, the conductivity period can be substantially determined by the diffusion process only. Thus, choosing materials that have diffusion rates that can be varied via voltage potentials, allows the present invention to dynamically alter a storage period of an organic memory cell.

An exemplary memory device is considered herein with respect to the equations 1-8 discussed above and illustrated in FIGS. 8-13.

Figure 8:
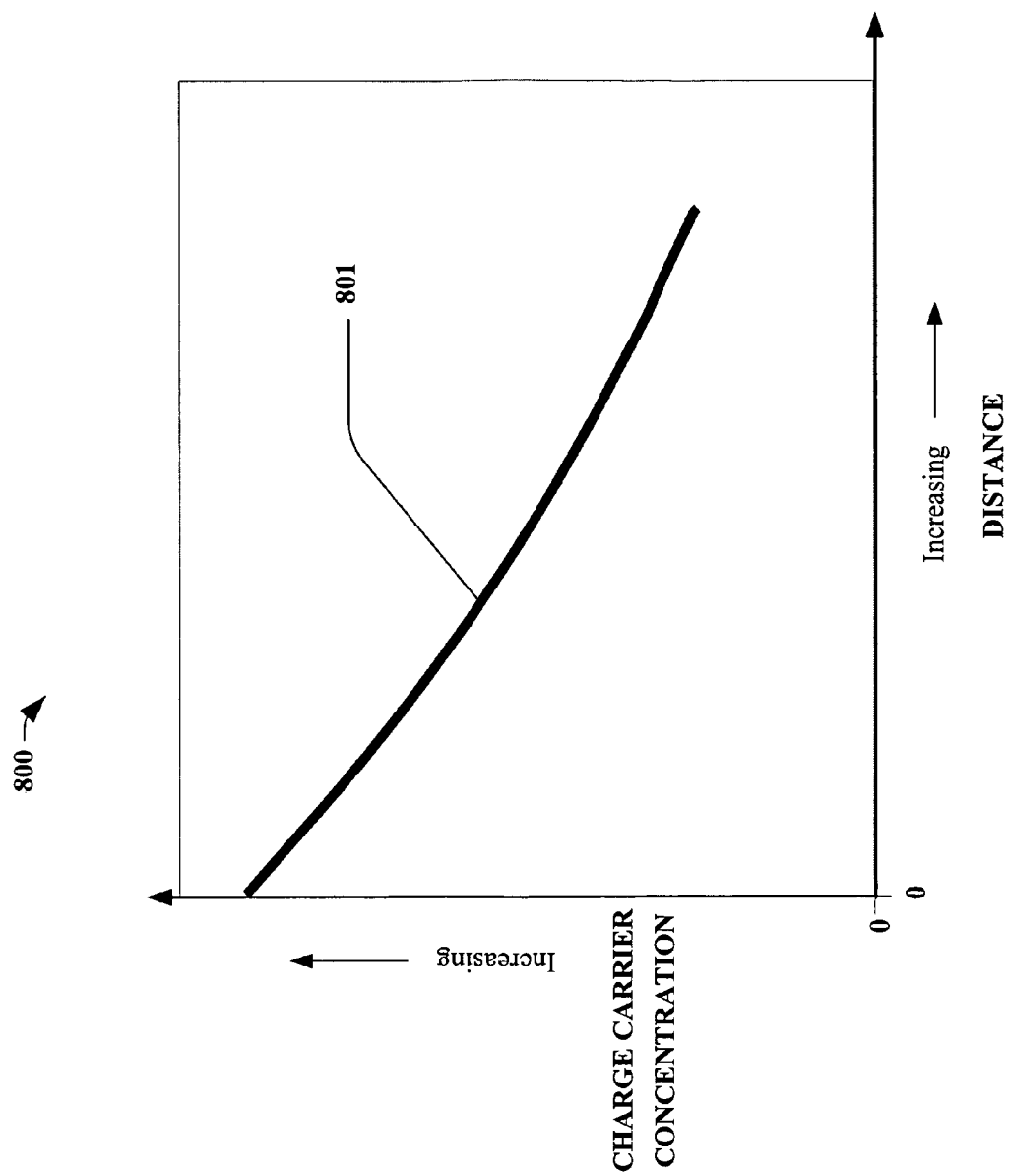
FIG. 8 is a graph illustrating charge carrier concentration of an exemplary memory device in accordance with an aspect of the present invention.

FIG. 8 depicts a graph 800 of charge carrier concentration 801 of the exemplary memory device as a function of distance from the passive layer and the organic material interface in accordance with an aspect of the invention. The charge carrier concentration 801 is shown as being a decreasing function of distance (x) from the interface. This graph 800 assumes an external voltage V=0 and a current J=0. The charge carrier concentration 801 is derived utilizing Eq. 5 with a constant field assumption. However, the graph shown is independent of the constant field assumption.

Figure 9:
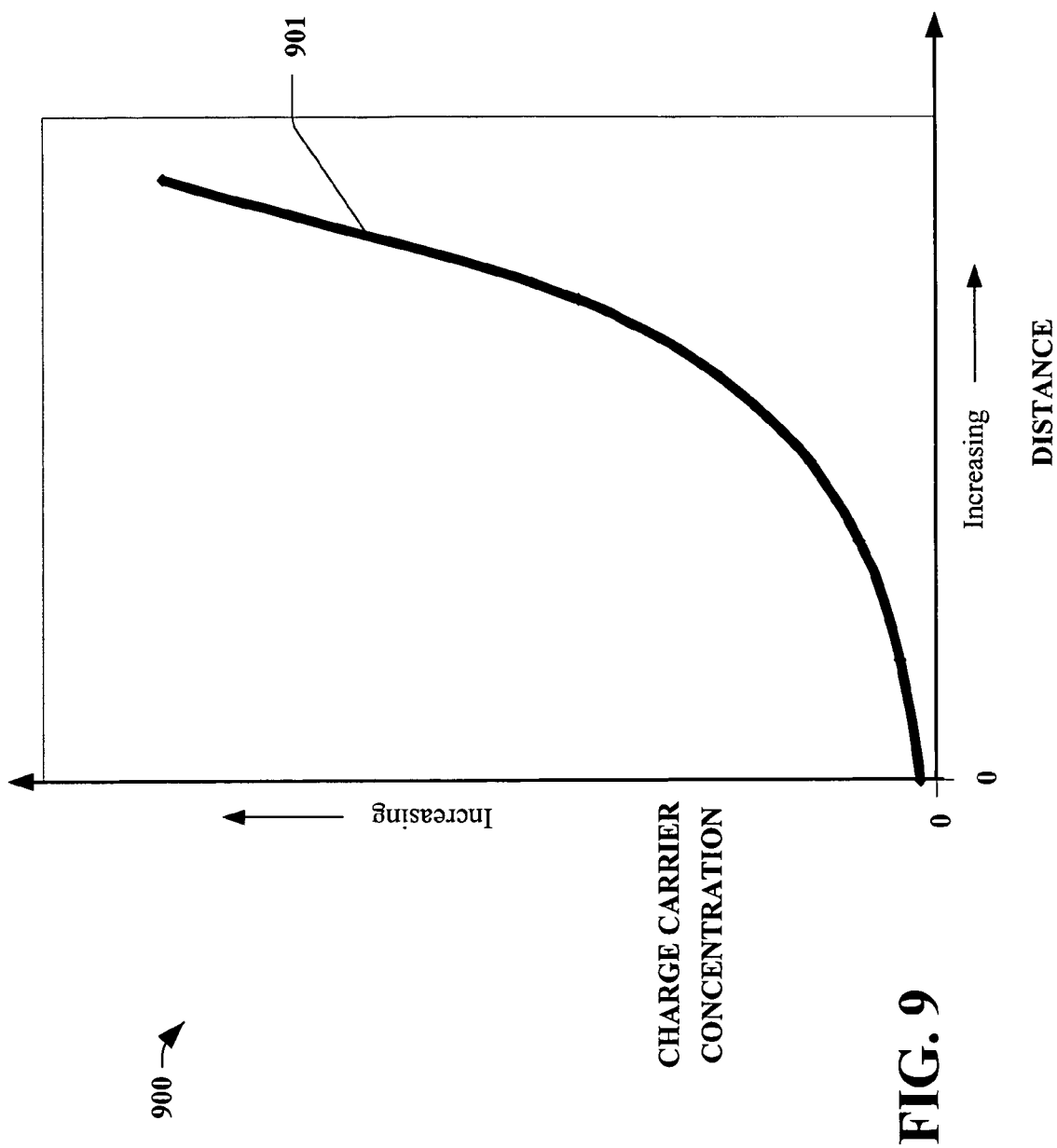
FIG. 9 is a graph illustrating charge carrier concentration of an exemplary memory device in accordance with an aspect of the present invention.

Turning now to FIG. 9, another graph 900 illustrating charge carrier concentration 901 for the exemplary organic memory device is depicted in accordance with an aspect of the present invention. For this graph 900, parameters are set as follows: forward voltage >0V and current flux J=0. The passive layer has a higher voltage than the organic conductor layer. This drives the charge carrier away from the passive layer and leads to charge carrier concentration that has an increase function of distance (x). Even at lowest concentration, p(0) is not a small value. This explains why the organic material is a good conductor (low resistivity) when forward voltage is applied. Again, it is Eq. 6 with constant electric field model used for the plot. The points demonstrated are independent of constant electric field assumption.

Figure 10:
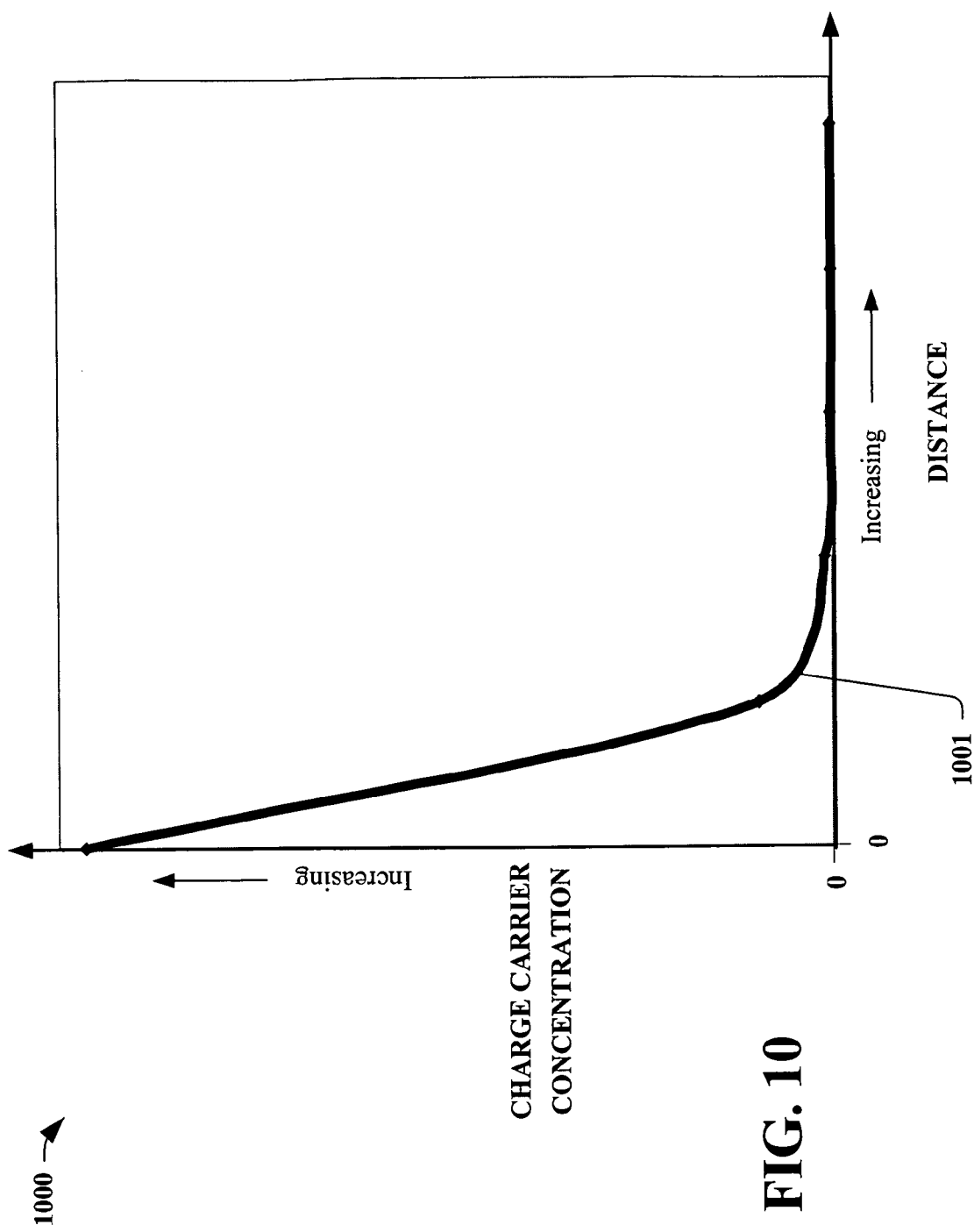
FIG. 10 is a graph illustrating charge carrier concentration of an exemplary memory device in accordance with an aspect of the present invention.

FIG. 10 depicts yet another graph 1000 of charge carrier concentration 1001 of the exemplary memory device as a function of distance from the passive layer and the organic material interface in accordance with an aspect of the invention. For this graph, the parameters are set such that the reverse voltage >0V and the current J=0. With reversed voltage, the charge carrier is concentrated at the passive layer and the organic material interface. It drops quickly to a small concentration when it is away from the interface, causing high resistivity when a high reversed voltage applied. Again, Eq. 5 with constant electric field model is assumed for the graph.

Figure 11:
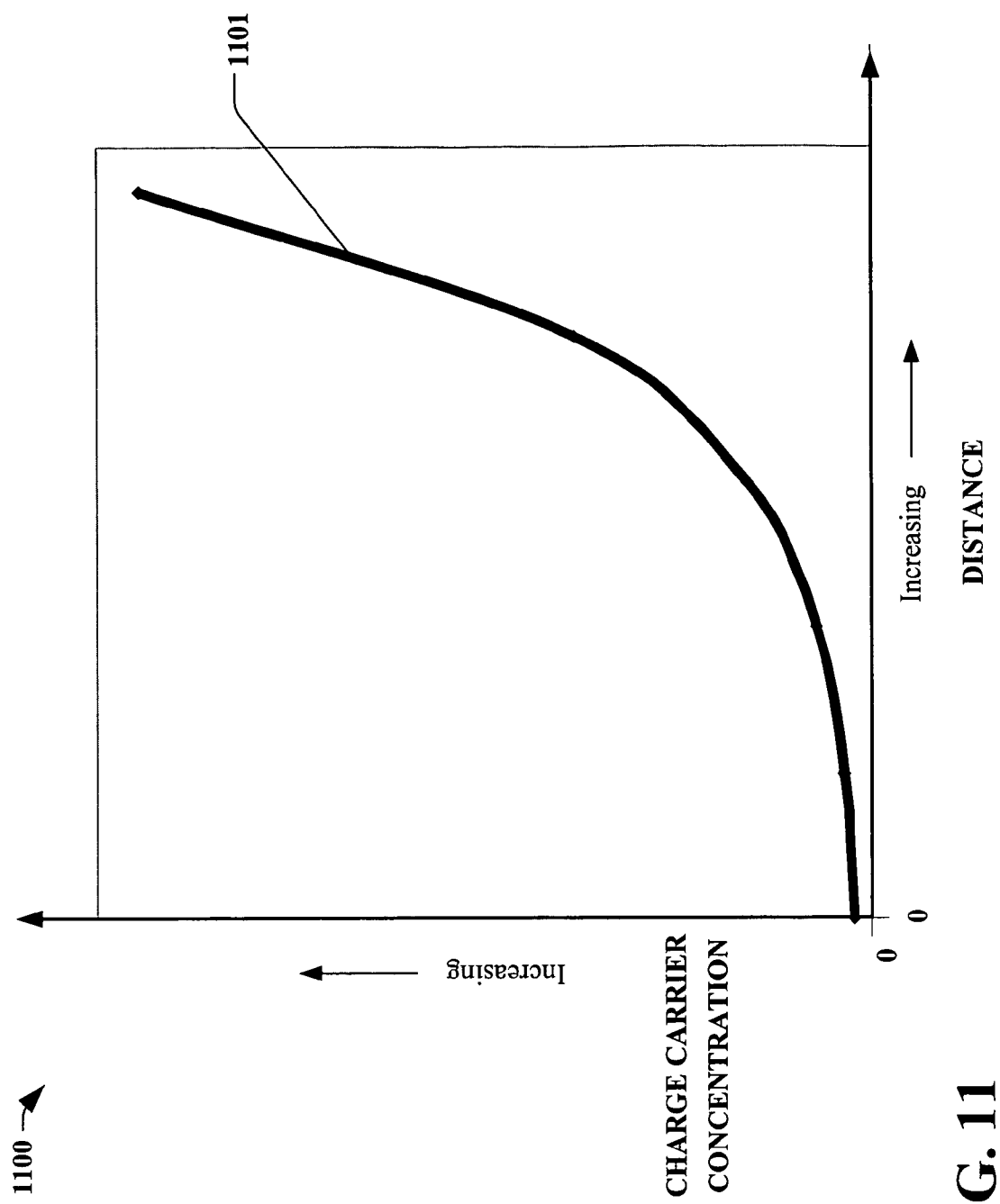
FIG. 11 is a graph illustrating charge carrier concentration of an exemplary memory device in accordance with an aspect of the present invention.

Referring now to FIG. 11, another graph 1100 that depicts charge carrier concentration 1101 of the exemplary memory device as a function of distance in accordance with an aspect of the present invention is provided. For this graph 1100, parameters are set as follows: forward voltage >0V and current flux J>0. When current flux J>0, the charge carrier is still an increase function of x because the forward voltage drives the charge carrier away from the passive layer interface. One important point is that the lowest concentration p(x) is at interface.

Figure 12:
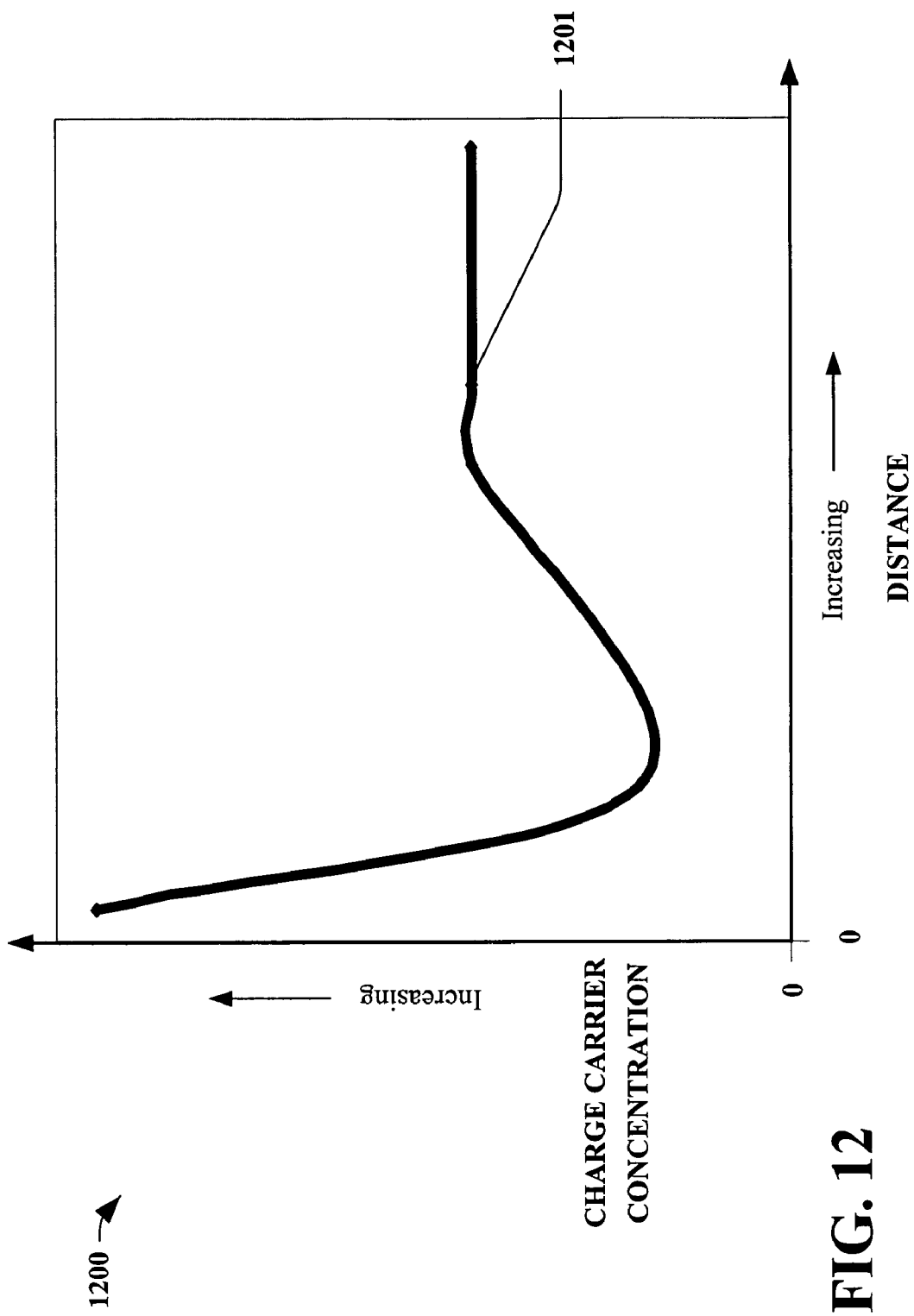
FIG. 12 is a graph illustrating charge carrier concentration at the interface of an exemplary memory device as function of applied voltage in accordance with an aspect of the present invention.

Moving on to FIG. 12, yet another graph 1200 of charge carrier concentration at the interface 1201 of the exemplary memory device as a function of forward voltage is depicted. For this graph, the parameters are set such that J initially=0 at low voltage and starts to be >0 when voltage reaches a threshold, and assumes a constant electric field model. The interface charge carrier concentration initially decreases and reaches minimum at a threshold voltage and starts to increase as voltage increases. This model is applicable when the diffusion constant of the organic material is small and there is constant electrical resistance. With this model, the charge carrier concentration at the interface is derived as a function of voltage. It is noted that $p_0(V)$ tends to be constant after forward voltage is large enough and the current is controlled by the charge carrier not charge injection at the interface. As such, p(0) can be rewritten as:

$$p(0) = \frac{1}{2}\left\{-K_{eq}[Polymer]_0 + \sqrt{(K_{eq}[Polymer]_0)^2 + \frac{4d_{CuS}K_{eq}[Polymer]_0[CuS]_0}{d}}\right\} \quad (9)$$

This Eq. 9 shows that limiting p(0) is an increase function of thickness ratio between the passive layer and the polymer layer.

Figure 13:
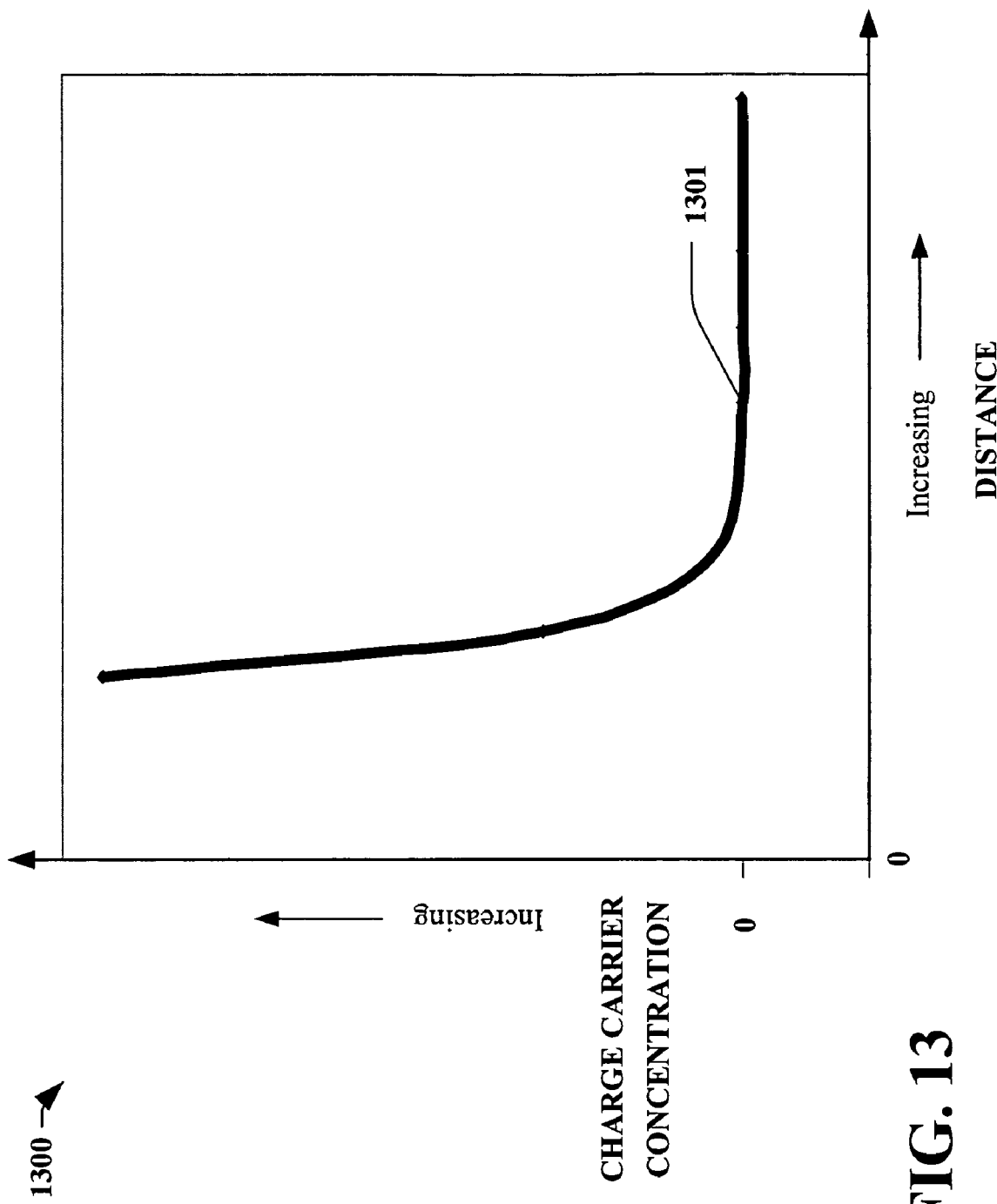
FIG. 13 is a graph illustrating charge carrier concentration at the interface of an exemplary memory device as function of applied voltage in accordance with an aspect of the present invention.

Referring to FIG. 13, another graph 1300 that depicts charge carrier concentration at the interface 1301 as a function of forward voltage is shown. For this graph 1300, p(0) is a function of forward voltage, current J, which may or may not be =0, and a step potential function model. This model assumes the voltage V(x) function can be described by a step function. The model is applicable when the diffusion constant of the polymer is very large. Therefore, the electrical resistance (resistive state) in the device is minimal. With this model, the charge carrier concentration at the interface is derived as the function of voltage. It is noted that in FIG. 13 that $p_0(V)$ tends to be zero after forward voltage is large enough. When the charge carrier at the interface controls the current flux, this value is a function of voltage. This zero limit behavior is due to the interface boundary limit set by the reaction (1). Basically, the fast charge carrier transportation from the interface to the other end reaches the supply limit. Thus, the limiting p(0) is also rewritten as:

$$p(0) = \frac{1}{2}\Bigg\{-K_{eq}[Polymer]_0 + \quad (10)$$

-continued $$\sqrt{(K_{eq}[Polymer]_0)^2 + \frac{4d_{CuS}K_{eq}[Polymer]_0[CuS]_0}{d\left[\exp\frac{V(0)-V}{V_t} - \frac{V(0)-V}{V_t}\right]}}\Bigg\}$$

Again p(0) is an increase function of thickness ratio between the passive layer and the polymer layer.

Regarding the above discussion, it is important to note that the flux measured is determined by charge carrier drift when limiting flux is in the organic material. Under constant electric field assumption, the function to describe the charge carrier concentration is $p(x) \cdot p_j = p(0)$ is met when the organic material determines limiting flux since the lowest concentration in the device is at the interface. This condition results in a constant p(x). This means the diffusion contribution to the flux in Eq. 5 is zero. Under step potential assumption, another function is employed to describe the charge carrier concentration p(x). The initial charge carrier concentration p(0) has a relatively substantially smaller value than other regions. Therefore, J is still determined by p(0). Another point that is noted regards boundary conditions. Unlike semiconductors, it is only applicable to the concentration at the interface, not everywhere. This boundary condition limits the total amount of the charge carrier produced in the device.

The equations above (E.q. 1-8) and FIGS. 9-12 describe and model behavior of an aspect of the present invention. This model can be employed to explain measured data and can be for other passive layer materials aside from CuS. Additionally, the model can be used to determine how to improve conductivity periods (retention) and response time and to design other devices such as a transistor. Further, the model can be employed to develop various threshold voltages that set the resistive (impedance) states, read the conductivity levels and erase the conductivity levels, thus performing memory device operations of writing or programming, reading, erasing, and retention time (conductivity periods).

Figure 14:
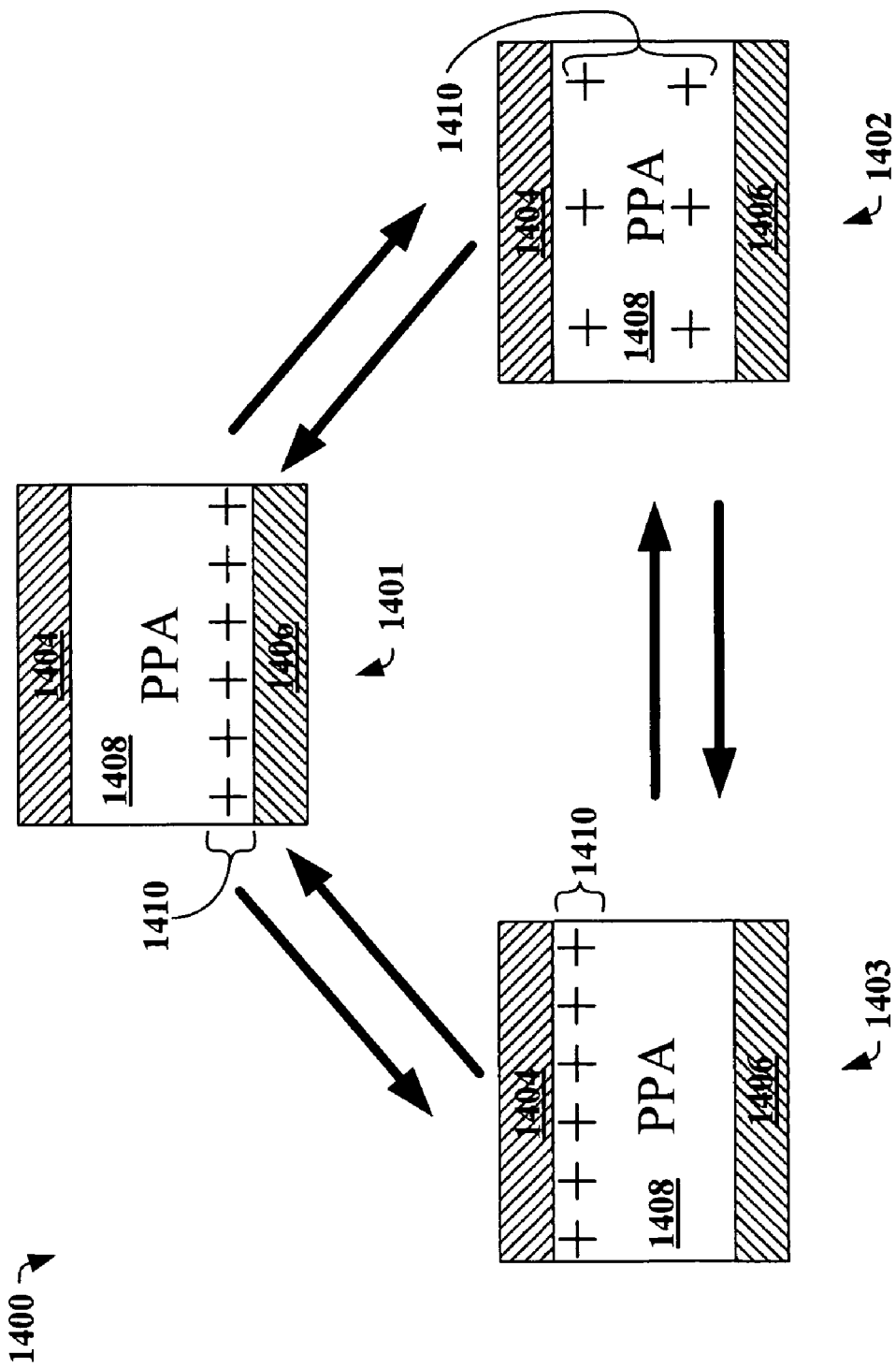
FIG. 14 is a block diagram depicting an organic memory device in various states in accordance with an aspect of the present invention.

In FIG. 14, a block diagram that illustrates an organic memory device 1400 in various states in accordance with an aspect of the present invention is illustrated. The device 1400 is depicted in a first "OFF" state 1401, an "ON" state 1402, and a second "OFF" state 1403. It is appreciated that memory devices formed in accordance with the present invention also has long and/or short retention states (not shown) and can have other states than those depicted in FIG. 14. The organic memory device 1400 comprises a top electrode 1404, a bottom electrode 1406 and a selectively conductive decay media layer 1408 comprising an organic conductor layer (e.g., PPA) and at least one passive layer (e.g., CuS).

In the first "OFF" state 1401, a positive charge 1410 collects in the selectively conductive decay media layer 1408 near the bottom electrode 1406. In the "ON" state 1402, the positive charge 1410 is uniformly distributed thereby indicating an "ON" state. In the second "OFF" state 1403, the positive charge 1410 collects in the selectively conductive decay media layer 1408 near the top electrode 1404. Likewise, although not illustrated, the positive charges can be induced to remain at their positions for a given time (retention time) by applying an appropriate voltage potential across the selectively conductive decay media layer 1408. This effectively produces long and/or short term storage.

A second mechanism is believed to be a process that has ionic transportation and ionic interaction with a polymer. For chelcogenide materials such as $Cu_2S$, $Ag_2S$, it is very common to have metal ions with high mobility because of their crystal defects, such as vacancy presence, and thermodynamically available stable phases under the same stoichiometry.

$$Cu2S \rightarrow Cu^+ + CuS^- \qquad (11)$$

These metal ions such as $Cu^+$ can move into the contacting polymer under a strong field. The metal ion functions as a dopant in conjugated polymer to produce a charge carrier.

$$Cu^+ + Polymer \rightarrow [Polymer\text{-}Cu]^+ \qquad (12)$$

The interaction between metal ions can be as strong as a ligand bond depending on the electronic structure of the metal ions and the conjugated polymer. Also, it is determined by an applied field that can push the metal ion to overcome an energy barrier in order to have proper bonding with the conjugated polymer. A fraction of a paired structure becomes doped and significantly increases the charge carrier concentration. Thus, a device's conductivity is enhanced dramatically.

The device loses persistence because the reaction reverts direction and metal ions move back to the passive layer.

$$[Polymer\text{-}Cu]^+ \rightarrow Cu^+ + Polymer \qquad (13)$$

The persistence of the device is determined by the strength of the "bond" between the polymer and metal ion. A stronger "bond" provides for longer persistence. Also, it is determined by the concentration of the metal ions in the polymer. The "bond strength" and metal ion concentration can be adjusted by varying an external electric field. Therefore, variable persistence can be achieved.

Figure 15:
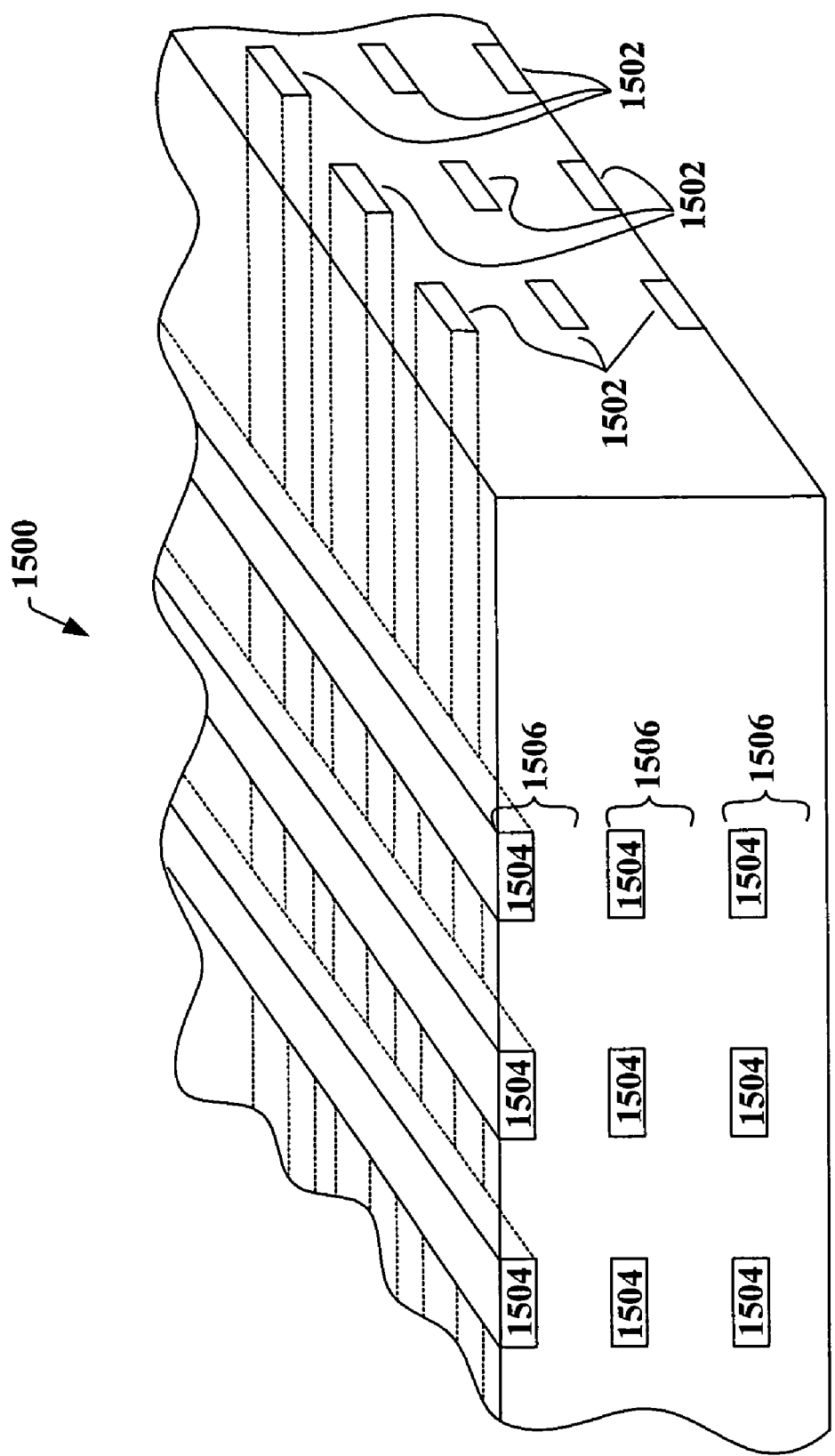
FIG. 15 is a three dimensional view of an organic memory device in accordance with an aspect of the present invention.

Referring to FIG. 15, a three dimensional view of an organic memory device 1500 containing a plurality of organic memory devices in accordance with an aspect of the invention is shown. The organic memory device 1500 contains a plurality of first electrodes 1502, a plurality of second electrodes 1504, and a plurality of memory device layers 1506. Between the respective first and second electrodes are the selectively conductive decay media (not shown). The plurality of first electrodes 1502 and the plurality of second electrodes 1504 are shown in substantially perpendicular orientation, although other orientations are possible. The three dimensional microelectronic organic memory device is capable of containing an extremely high number of memory devices thereby improving device density. Peripheral circuitry and devices are not shown for brevity.

The organic memory devices are useful in any device requiring memory. For example, the organic memory devices are useful in computers, appliances, industrial equipment, handheld devices, telecommunications equipment, medical equipment, research and development equipment, transportation vehicles, radar/satellite devices, and the like. Handheld devices, and particularly handheld electronic devices, achieve improvements in portability due to the small size and light weight of the organic memory devices. Examples of handheld devices include cell phones and other two way communication devices, personal data assistants, palm pilots, pagers, notebook computers, remote controls, recorders (video and audio), radios, small televisions and web viewers, cameras, and the like. The present invention can also be utilized in an array of memory cells, enabling long and/or short term memory in a single device.

Figure 16:
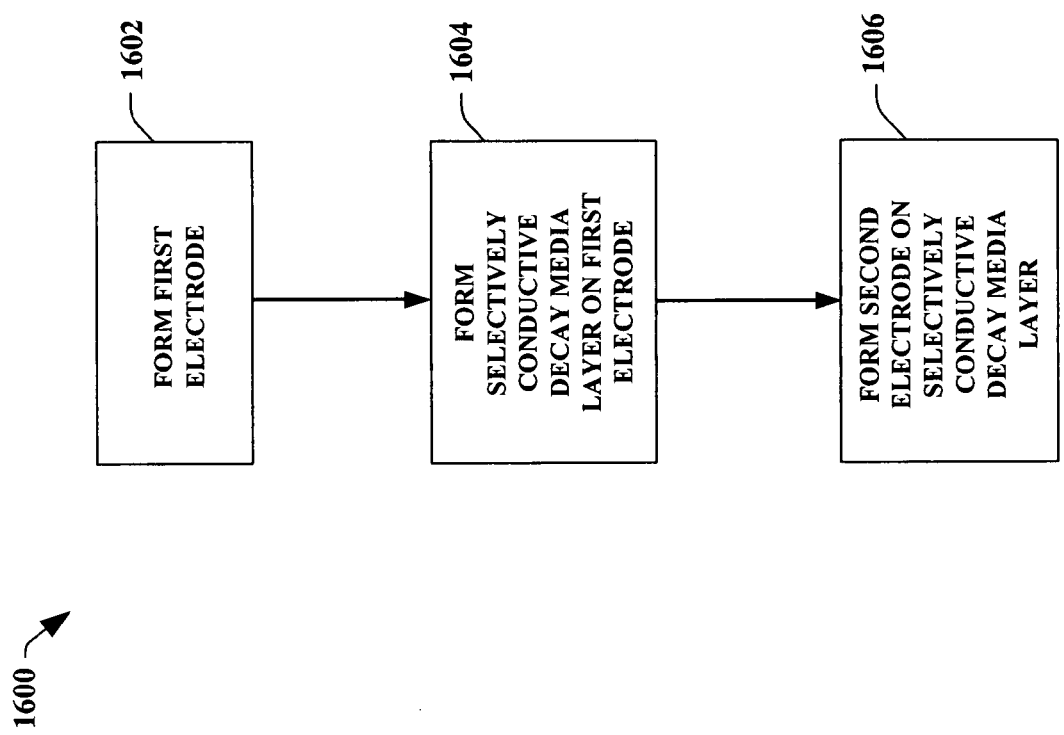
FIG. 16 is a flow diagram illustrating a method of fabricating an organic memory device in accordance with an aspect of the present invention.
Figure 17:
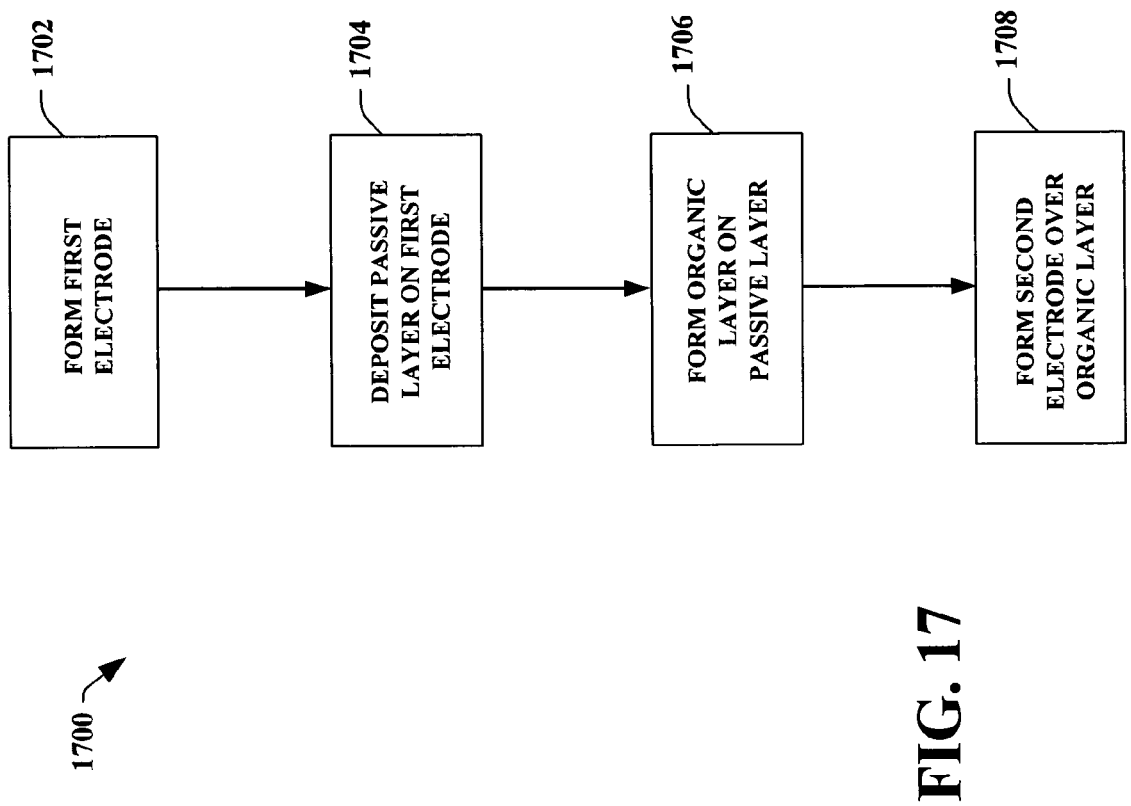
FIG. 17 is another flow diagram illustrating a method of fabricating an organic memory device in accordance with an aspect of the present invention.

In view of the foregoing structural and functional features described above, methodologies in accordance with various aspects of the present invention will be better appreciated with reference to FIGS. 16-17. While for purposes of simplicity of explanation, the methodologies of FIGS. 16-17 are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

Turning to FIG. 16, a flow diagram of a method 1600 of fabricating an organic memory device in accordance with an aspect of the invention is illustrated. A first electrode is formed on a substrate at 1602. The first electrode is comprised of a conductive material such as, aluminum, chromium, copper, germanium, gold, magnesium, manganese, indium, iron, nickel, palladium, platinum, silver, titanium, zinc, alloys thereof, indium-tin oxide, polysilicon, doped amorphous silicon, metal silicides, and the like. Exemplary alloys that can be utilized for the conductive material include Hastelloy®, Kovar®, Invar, Monel®, Inconel®, brass, stainless steel, magnesium-silver alloy, and various other alloys. The thickness of the first electrode can vary depending on the implementation and the memory device being constructed. However, some exemplary thickness ranges include about 0.01 µm or more and about 10 µm or less, about 0.05 µm or more and about 5 µm or less, and/or about 0.1 µm or more and about 1 µm or less.

After forming the first electrode, a selectively conductive decay media layer is formed on the first electrode at 1604. The conductive decay properties of this media (e.g., exponential decay rate, logarithmic decay rate, and the like) can be modified in a controlled manner by applying varying voltage potentials across the media via the electrodes and in order to alter a resistive state of the organic memory device.

A second electrode is then formed over the organic layer at 1606. The second electrode is formed of a conductive material in a manner similar to that of the first electrode. The second electrode can, but is not required to, be formed of the same conductive material as the first electrode.

Turning to FIG. 17, a flow diagram of a method 1700 of fabricating an organic memory device in accordance with an aspect of the invention is illustrated. A first electrode is formed on a substrate at 1702. The first electrode is comprised of a conductive material such as, aluminum, chromium, copper, germanium, gold, magnesium, manganese, indium, iron, nickel, palladium, platinum, silver, titanium, zinc, alloys thereof, indium-tin oxide, polysilicon, doped amorphous silicon, metal silicides, and the like. Exemplary alloys that can be utilized for the conductive material include Hastelloy®, Kovar®, Invar, Monel®, Inconel®, brass, stainless steel, magnesium-silver alloy, and various other alloys. The thickness of the first electrode can vary depending on the implementation and the memory device being constructed. However, some exemplary thickness ranges include about 0.01 µm or more and about 10 µm or less, about 0.05 µm or more and about 5 µm or less, and/or about 0.1 µm or more and about 1 µm or less.

After forming the first electrode, a passive layer is deposited on the first electrode at 1704. The passive layer contains at least one charge carrier assisting material that contributes to the conductive properties of the selectively conductive decay media. The charge carrier assisting material has the ability to donate and accept charges (holes and/or electrons). Generally, the charge carrier assisting material has at least two relatively stable oxidation-reduction states. The two relatively stable states permit the charge carrier assisting material to donate and accept charges and electrically interact with the organic conductor layer. The particular charge carrier assisting material employed is selected so that the two relatively stable states match with the two relatively stable states of the conjugated organic molecules of the organic conductor layer.

The passive layer can, in some instances, act as a catalyst when forming the organic conductor layer. In this configuration, the backbone of the conjugated organic molecule may initially form adjacent the passive layer, and grow or assemble away and substantially perpendicular to the passive layer surface. As a result, the backbones of the conjugated organic molecules are self-aligned in a direction that traverses the two electrodes.

Examples of charge carrier assisting material that may make up the passive layer include one or more of the following: nickel arsenide (NiAs), cobalt arsenide ($CoAs_2$), copper sulfide ($Cu_2S$, CuS), copper oxide (CuO, $Cu_2O$), manganese oxide ($MnO_2$), titanium dioxide ($TiO_2$), indium oxide ($I_3O_4$), silver sulfide ($Ag_2S$, AgS), iron oxide ($Fe_3O_4$), and the like. The passive layer 1704 is typically grown using oxidation techniques, formed by gas phase reactions, or deposited between the electrodes.

The passive layer has a suitable thickness that can vary according to the implementation and/or memory device being fabricated. Some examples of suitable thicknesses for the passive layer are as follows: a thickness of about 2 Å or more and about 0.1 µm or less, a thickness of about 10 Å or more and about 0.01 µm or less, and a thickness of about 50 Å or more and about 0.005 µm or less.

Next, an organic conductor layer is formed on the passive layer. The organic conductor layer comprises a conjugated molecule(s). Such conjugated molecules are characterized in that they have overlapping π orbitals and that they can assume two or more resonant structures. The organic molecules may be cyclic or acyclic. During formation or deposition, the organic molecule self assembles between the electrodes. Examples of conjugated organic materials include one or more of polyacetylene (cis or trans); polyphenylacetylene (cis or trans); polydiphenylacetylene; polyaniline; poly (p-phenylene vinylene); polythiophene; polyporphyrins; porphyrinic macrocycles, thiol derivatized polyporphyrins; polymetallocenes such as polyferrocenes, polyphthalocyanines; polyvinylenes; polystiroles; and the like. Additionally, the properties of the polymer can be modified by doping with a suitable dopant (e.g., salt).

The organic conductor layer is formed with a suitable thickness that depends upon the chosen implementations and/or the memory device being fabricated. Some suitable exemplary ranges of thickness for the organic conductor layer are about 0.001 µm or more and about 5 µm or less, about 0.01 µm or more and about 2.5 µm or less, and about a thickness of about 0.05 µm or more and about 1 µm or less.

The organic conductor layer can be formed by a number of suitable techniques, some of which are described above. One suitable technique that can be utilized is a spin-on technique that involves depositing a mixture of the polymer/polymer precursor and a solvent, and then removing the solvent from the substrate/electrode. Another technique is chemical vapor deposition (CVD) optionally including a gas reaction, gas phase deposition, and the like. CVD includes low pressure chemical vapor deposition (LPCVD), plasma enhanced chemical vapor deposition (PECVD), and high density chemical vapor deposition (HDCVD). It is not typically necessary to functionalize one or more ends of the organic molecule in order to attach it to an electrode/passive layer.

In order to facilitate operation of the organic memory device, the organic conductor layer is generally substantially thicker than the passive layer. As one example, the thickness of the organic conductor layer is from about 1 to about 500 times greater than the thickness of the passive layer. It is appreciated that other suitable ratios can be employed in accordance with the present invention.

The conductive decay properties of this media (e.g., exponential decay rate, logarithmic decay rate, and the like) can be modified in a controlled manner by applying varying voltage potentials across the media via the electrodes and in order to alter a resistive state of the organic memory device.

Finally, a second electrode is formed over the organic layer at 1708. The second electrode is formed of a conductive material in a manner similar to that of the first electrode. The second electrode can, but is not required to, be formed of the same conductive material as the first electrode.

One skilled in the art can also appreciate that the supra devices and methods can also be applied to systems that operate devices utilizing the present invention. A system can be comprised of a means for determining a desired persistence for information to be stored in at least one memory cell and a means for setting at lease one resistive state of at least one memory cell based, at least in part, upon desired persistence for the information. The determination of a desired persistence state can include, but is not limited to, determining whether information is useful after a power interrupt and/or is critical to performance of a device during and/or after a power interrupt. A user could also specify that the information needs to be nonvolatile (e.g., "backed up"). The system itself could also make the determination as to what information is critical. This criticality can change dynamically and the present invention can also change dynamically with the criticality change to a short term and/or long term persistence state. Thus, for example, once the criticality of the information is known, the resistive state (and, thus, the decay rate) of the present invention can be set to reflect a desired persistence state. This can be accomplished by taking into account materials employed in a selectively conductive decay media. The media can comprise several decay rates that can be predetermined and/or dynamically assessed during operation. The resistive state can be set, for example, by a voltage potential device designed for this purpose and/or by a voltage potential device designed for reading, writing and erasing a memory cell.

A system can also be comprised of a means for determining a power state of a device utilizing an organic memory cell comprising a selectively conductive decay media and a means for setting at least one resistive state of at least one organic memory cell based, at least in part, upon at least one selected from the group consisting of a current power state and an imminent power state. Due to the dynamic capability of the present invention to change persistence of stored information, it can be uniquely employed in a system based upon determination of a power state of a device. This allows the system to perform almost instantaneous boot-up back to a pre-power down state and/or pre-power interrupted state. Typically, a system has forewarning as to imminent changes in power states (i.e., soft shutdown). This allows the system to "get ready" to shutdown. At this point, a determination can be made to change persistence of information stored in a memory cell in order to preserve it after shutdown. In the same manner, a system working on and/or using critical information can determine that an unexpected power interruption would destroy valuable data. If this determination is made, the persistence of information stored in memory can be changed to protect the data in case of an unplanned power interrupt. Again, one skilled in the art can appreciate the tremendous flexibility the present invention provides for preserving data, both in a predetermined fashion and also in a dynamic fashion. Thus, the brevity of what is described supra is not meant to limit the scope of the present invention.

What has been described above is one or more aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in either the detailed description or the claims, such term is intended to be inclusive in a manner similar to the term "comprising."

What is claimed is:

1. An organic memory device, comprising:
   a first electrode;
   a selectively conductive decay media formed on the first electrode, responsive to a resistive state of an organic memory device and facilitating at least one desired characteristic of a state of the organic memory device;
   a second electrode formed on the selectively conductive decay media;
   a means for setting at least one resistive state of the selectively conductive decay media via the first and second electrodes, based, at least in part, upon the desired characteristic for the state of the organic memory device; and
   a means for determining at least one resistive state of the selectively conductive decay media via the first and second electrodes, the means for determining at least one resistive state comprising applying at least one voltage potential across the first and second electrodes, the voltage potential comprising from about 10 to about 200 millivolts.

2. The device of claim 1, the desired characteristic comprising a combination of a plurality of characteristics including high impedance, short persistence, high density, low power consumption, and high speed.

3. The device of claim 1, the desired characteristic comprising a combination of a plurality of characteristics including low impedance, long persistence, low density, high power consumption.

4. The device of claim 1, the desired characteristic comprising at least one selected from the group consisting of memory impedance, memory persistence, memory density, memory speed, and memory power utilization.

5. The device of claim 4, the memory persistence comprising at least one persistence mode controllable via applying at least one voltage potential across the first and second electrodes.

6. The device of claim 4, the memory density comprising at least one memory density mode controllable via applying at least one voltage potential across the first and second electrodes.

7. The device of claim 4, the memory power utilization comprising at least one memory power utilization mode controllable via applying at least one voltage potential across the first and second electrodes.

8. The device of claim 4, the memory speed comprising at least one memory speed mode controllable via applying at least one voltage potential across the first and second electrodes.

9. The device of claim 8, the memory speed mode comprising at least one selected from the group consisting of a writing speed mode and a erasing speed mode.

10. The device of claim 9, the writing speed mode comprising a high speed writing mode that utilizes a range of approximately 2 to 5 volts of potential across the first and second electrodes to increase programming performance of at least one memory cell.

11. The device of claim 1, the means for setting at least one resistive state including applying a voltage potential across the first and second electrodes.

12. The device of claim 1, the means for setting at least one resistive state including applying a plurality of voltage potentials across the first and second electrodes to achieve a plurality of resistive states representative of multiple bit states per cell in at least one memory cell.

13. The device of claim 1, the selectively conductive decay media having at least one attribute selected from the group consisting of a substantially exponential decay of conductivity occurring when the organic memory device has a high resistive state and a substantially logarithmic decay of conductivity occurring when the organic memory device has a low resistive state.

14. The device of claim 1, the selectively conductive decay media comprising a passive layer formed on the first electrode and an organic polymer layer formed on the passive layer.

15. The device of claim 14, the passive layer comprising at least one selected from the group consisting of nickel arsenide (NiAs), cobalt arsenide ($CoAs_2$), copper sulfide ($Cu_2S$, CuS), copper oxide (CuO, $Cu_2O$), manganese oxide ($MnO_2$), titanium dioxide ($TiO_2$), indium oxide ($I_3O_4$), silver sulfide ($Ag_2S$, AgS), and iron oxide ($Fe_3O_4$).

16. The device of claim 14, the organic layer being selected from the group consisting of polyacetylene, polyphenylacetylene, polydiphenylacetylene, polyaniline, poly(p-phenylene vinylene), polythiophene, polyporphyrins, porphyrinic macrocycles, thiol derivatized polyporphyrins, polymetallocenes, polyferrocenes, polyphthalocyanines, polyvinylenes, and polystiroles.

17. The device of claim 14, the organic layer having a thickness of about 0.001 μm or more and about 5 μm or less.

18. An organic memory device, comprising:
    a first electrode;
    a selectively conductive decay media formed on the first electrode, responsive to a resistive state of the organic memory device and facilitating at least one desired characteristic of a state of the organic memory device, the selectively conductive decay media having at least one attribute selected from the group consisting of a substantially exponential decay of conductivity occurring when the organic memory device has a high resistive state and a substantially logarithmic decay of conductivity occurring when the organic memory device has a low resistive state;

a second electrode formed on the selectively conductive decay media;

a means for determining a power state of an electronic device utilizing the organic memory device; and a means for setting at least one resistive state of the organic memory device via the first and second electrodes, based, at least in part, upon at least one selected from the group consisting of a current power state and an imminent power state.

19. The device of claim 18, the means for setting at least one resistive state including providing long term storage when the current power state is ON and the imminent power state is OFF.

20. A method of operating an organic memory device, comprising:
    determining at least one desired characteristic for information to be stored in at least one memory cell; and
    setting at least one resistive state of at least one memory cell based, at least in part, upon the desired characteristic for the information, the resistive state having at least one attribute selected from the group consisting of a substantially exponential decay of conductivity occurring when the organic memory device has a high resistive state and a substantially logarithmic decay of conductivity occurring when the organic memory device has a low resistive state.

21. The method of claim 20, the desired characteristic comprising at least one selected from the group consisting of information state, information persistence, information density, and information speed.

22. The method of claim 20, further including:
    determining an appropriate resistive state necessary to achieve the desired characteristic.

23. The method of claim 22, the appropriate resistive state comprising at least one selected from the group consisting of a high resistive state for short term memory persistence and a low resistive state for long term memory persistence.

24. A method of operating an organic memory device comprising:
    determining a power state of an electronic device utilizing an organic memory cell comprising a selectively conductive decay media, the selectively conductive decay media having at least one attribute selected from the group consisting of a substantially exponential decay of conductivity occurring when the organic memory device has a high resistive state and a substantially logarithmic decay of conductivity occurring when the organic memory device has a low resistive state; and
    setting at least one resistive state of at least one organic memory cell based, at least in part, upon at least one selected from the group consisting of a current power state and an imminent power state.

25. The method of claim 24, further including altering the resistive state based upon the power state to provide long term storage when the current power state is ON and the imminent power state is OFF.

26. The device of claim 18, the desired characteristic comprising a combination of a plurality of characteristics including high impedance, short persistence, high density, low power consumption, and high speed.

27. The device of claim 18, the desired characteristic comprising a combination of a plurality of characteristics including low impedance, long persistence, low density, high power consumption.

28. The device of claim 18, the desired characteristic comprising at least one selected from the group consisting of memory impedance, memory persistence, memory density, memory speed, and memory power utilization.

* * * * *